United States Patent
Wada et al.

(10) Patent No.: US 9,608,074 B2
(45) Date of Patent: Mar. 28, 2017

(54) SILICON CARBIDE SEMICONDUCTOR DEVICE AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Keiji Wada, Osaka (JP); Toru Hiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/917,551

(22) PCT Filed: Aug. 1, 2014

(86) PCT No.: PCT/JP2014/070329
§ 371 (c)(1),
(2) Date: Mar. 8, 2016

(87) PCT Pub. No.: WO2015/040966
PCT Pub. Date: Mar. 26, 2015

(65) Prior Publication Data
US 2016/0225854 A1    Aug. 4, 2016

(30) Foreign Application Priority Data
Sep. 17, 2013   (JP) .................................. 2013-191866

(51) Int. Cl.
*H01L 27/00* (2006.01)
*H01L 29/16* (2006.01)
(Continued)

(52) U.S. Cl.
CPC ...... *H01L 29/1608* (2013.01); *H01L 29/0619* (2013.01); *H01L 29/0623* (2013.01);
(Continued)

(58) Field of Classification Search
CPC ............. H01L 29/1095; H01L 29/7813; H01L 29/1608; H01L 29/7395; H01L 29/7802
See application file for complete search history.

(56) References Cited

U.S. PATENT DOCUMENTS 5,969,378 A * 10/1999 Singh .................. H01L 29/1608
257/133
6,037,632 A    3/2000 Omura et al.
(Continued)

FOREIGN PATENT DOCUMENTS

JP      09-191109 A    7/1997
JP      2000-509559 A   7/2000
(Continued)

OTHER PUBLICATIONS

International Search Report in PCT International Application No. PCT/JP2014/070329, dated Sep. 9, 2014.

*Primary Examiner* — Ngan Ngo
(74) *Attorney, Agent, or Firm* — IPUSA, PLLC

(57) ABSTRACT

A silicon carbide semiconductor device includes a silicon carbide substrate, a gate electrode, and a drain electrode. A trench is formed in a second main surface of the silicon carbide substrate. The silicon carbide substrate includes a first conductivity type region, a body region, a source region, and a first second conductivity type region surrounded by the first conductivity type region. The trench is formed of a side wall surface and a bottom portion. An impurity concentration of the first second conductivity type region is lower than an impurity concentration of the first conductivity type region. The first second conductivity type region is provided so as to face a region between a first contact point and a second contact point and be separated apart from a first main surface.

15 Claims, 15 Drawing Sheets

(51) Int. Cl.
   *H01L 29/78*   (2006.01)
   *H01L 29/739*  (2006.01)
   *H01L 29/66*   (2006.01)
   *H01L 29/06*   (2006.01)
   *H01L 29/10*   (2006.01)

(52) U.S. Cl.
   CPC .... *H01L 29/1095* (2013.01); *H01L 29/66068* (2013.01); *H01L 29/7395* (2013.01); *H01L 29/7802* (2013.01); *H01L 29/7813* (2013.01); *H01L 29/0634* (2013.01)

(56) References Cited

U.S. PATENT DOCUMENTS

| | | | | |
|---|---|---|---|---|
| 2005/0062048 | A1* | 3/2005 | Hayashi | H01L 29/7828 257/77 |
| 2006/0244054 | A1 | 11/2006 | Kobayashi | |
| 2007/0013000 | A1 | 1/2007 | Shiraishi | |
| 2009/0114969 | A1* | 5/2009 | Suzuki | H01L 29/0619 257/301 |
| 2009/0272982 | A1* | 11/2009 | Nakamura | H01L 29/66068 257/77 |
| 2011/0291110 | A1* | 12/2011 | Suzuki | H01L 29/1095 257/77 |
| 2012/0228640 | A1* | 9/2012 | Masuda | H01L 29/045 257/77 |
| 2012/0248461 | A1* | 10/2012 | Masuda | H01L 21/3065 257/77 |
| 2012/0286355 | A1* | 11/2012 | Mauder | H01L 21/0228 257/330 |
| 2013/0065384 | A1* | 3/2013 | Hiyoshi | H01L 21/3065 438/589 |
| 2013/0075759 | A1* | 3/2013 | Wada | H01L 21/0475 257/77 |
| 2013/0130482 | A1* | 5/2013 | Masuda | H01L 21/3065 438/507 |
| 2014/0175459 | A1* | 6/2014 | Yamamoto | H01L 29/1095 257/77 |
| 2014/0252374 | A1* | 9/2014 | Wada | H01L 29/1608 257/77 |

FOREIGN PATENT DOCUMENTS

| | | |
|---|---|---|
| JP | 2006-310621 A | 11/2006 |
| JP | 2007-027193 A | 2/2007 |
| JP | 2008-091853 A | 4/2008 |
| JP | 2010-027680 A | 2/2010 |
| JP | 2012-191229 A | 10/2012 |
| WO | WO-97/47045 A1 | 12/1997 |
| WO | WO 99/26296 | 5/1999 |
| WO | WO-2013/031212 A1 | 3/2013 |

* cited by examiner

SILICON CARBIDE SEMICONDUCTOR DEVICE AND METHOD FOR MANUFACTURING SILICON CARBIDE SEMICONDUCTOR DEVICE

TECHNICAL FIELD

The present invention relates to a silicon carbide semiconductor device and a method for manufacturing the silicon carbide semiconductor device, and particularly to a silicon carbide semiconductor device provided with a trench and a method for manufacturing the silicon carbide semiconductor device.

BACKGROUND ART

In recent years, in order to achieve high breakdown voltage, low loss, use under a high temperature environment, and the like in a semiconductor device such as a MOSFET (Metal Oxide Semiconductor Field Effect Transistor), silicon carbide has begun to be adopted as a material constituting a semiconductor device. Silicon carbide is a wide bandgap semiconductor having a band gap larger than that of silicon, which has been conventionally widely used as a material constituting a semiconductor device. Therefore, by adopting silicon carbide as a material constituting a semiconductor device, the semiconductor device can achieve high breakdown voltage, reduced on resistance, and the like. Moreover, a semiconductor device adopting silicon carbide as its material also has an advantage that its characteristics are less likely to be deteriorated when it is used under the high temperature environment, when compared with a semiconductor device adopting silicon as its material.

Japanese National Patent Publication No. 2000-509559 (PTD 1) discloses a silicon carbide field effect transistor having a gate trench. The silicon carbide field effect transistor has a highly concentrated p-region provided near a bottom portion of the gate trench, and the highly concentrated p-region is connected to a p-body region.

CITATION LIST

Patent Document

PTD 1: Japanese National Patent Publication No. 2000-509559

SUMMARY OF INVENTION

Technical Problem

However, the silicon carbide field effect transistor disclosed in Japanese National Patent Publication No. 2000-509559 has a large electric capacity between gate and drain, and the switching characteristics have not been improved sufficiently.

The present invention has been made to solve the problem as described above, and an object of the present invention is to provide a silicon carbide semiconductor device capable of improving the switching characteristics and a method for manufacturing the silicon carbide semiconductor device.

Solution to Problem

A silicon carbide semiconductor device in accordance with the present invention includes a silicon carbide substrate, a gate electrode, and a drain electrode. The silicon carbide substrate has a first main surface and a second main surface opposite to the first main surface, and a trench is formed in the second main surface. The gate electrode is provided in the trench. The drain electrode is provided in contact with the first main surface. The silicon carbide substrate includes a first conductivity type region forming the first main surface and having a first conductivity type, a body region being provided on the first conductivity type region and having a second conductivity type which is different from the first conductivity type, a source region being provided on the body region so as to be separated apart from the first conductivity type region, forming the second main surface, and having a first conductivity type, and a first second conductivity type region being surrounded by the first conductivity type region and having the second conductivity type. The trench is formed of a side wall surface penetrating through the source region and the body region to reach the first conductivity type region, and a bottom portion being located in the first conductivity type region. The side wall surface has a first side wall surface and a second side wall surface facing each other when viewed in a cross section. An impurity concentration of the first second conductivity type region is lower than an impurity concentration of the first conductivity type region. When viewed in a cross section, and it is provided that a contact point at which a boundary surface between the first conductivity type region and the body region is in contact with the first side wall surface is a first contact point, and that a contact point at which a boundary surface between the first conductivity type region and the body region is in contact with the second side wall surface is a second contact point, the first second conductivity type region is provided so as to face a region between the first contact point and the second contact point and be separated from the first main surface.

A method for manufacturing a silicon carbide semiconductor device in accordance with the present invention includes the following steps. A silicon carbide substrate having a first main surface and a second main surface opposite to the first main surface and having a trench formed in the second main surface is prepared. A gate electrode is formed in the trench. A drain electrode is formed in contact with the first main surface. The silicon carbide substrate includes a first conductivity type region forming the first main surface and having a first conductivity type, a body region being provided on the first conductivity type region and having a second conductivity type which is different from the first conductivity type, a source region being provided on the body region so as to be separated apart from the first conductivity type region, forming the second main surface, and having the first conductivity type, and a first second conductivity type region being surrounded by the first conductivity type region and having the second conductivity type. The trench is formed of a side wall surface penetrating through the source region and the body region to reach the first conductivity type region, and a bottom portion located in the first conductivity type region. The side wall surface has a first side wall surface and a second side wall surface facing each other when viewed in a cross section. An impurity concentration of the first second conductivity type region is lower than an impurity concentration of the first conductivity type region. When viewed in a cross section, and it is provided that a contact point at which a boundary surface between the first conductivity type region and the body region is in contact with the first side wall surface is a first contact point, and that a contact point at which a boundary surface between the first conductivity type region and the body region is in contact with the second side wall surface is a second contact point, the first second conductivity type region is provided so as to face a region between the first contact point and the second contact point and be separated from the first main surface. Accordingly, since the electric capacity between the gate electrode and the drain electrode can be reduced effectively, the switching characteristics of the silicon carbide semiconductor device can be improved.

Advantageous Effects of Invention

As described above, according to the present invention, a silicon carbide semiconductor device capable of improving the switching characteristics and a method for manufacturing the silicon carbide semiconductor device can be provided.

DESCRIPTION OF EMBODIMENTS

Figure 1:
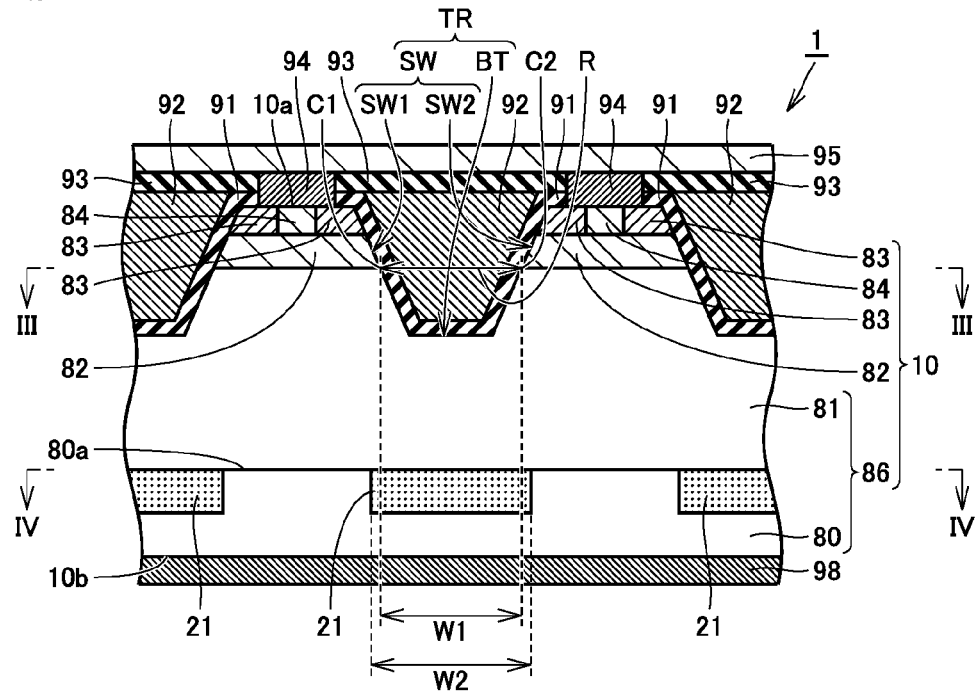
FIG. 1 is a schematic cross sectional view schematically showing a configuration of a silicon carbide semiconductor device in accordance with a first embodiment of the present invention.

Description of Embodiments of the Present Invention

Hereinafter, embodiments of the present invention will be described with reference to the drawings. It should be noted that, in the below-mentioned drawings, the same or corresponding portions are given the same reference characters and are not described repeatedly. Further, regarding crystallographic indications in the present specification, an individual orientation is represented by [ ], a group orientation is represented by < >, an individual plane is represented by ( ) and a group plane is represented by { }. In addition, a negative crystallographic index is normally expressed by putting "—" (bar) above a numeral, but is expressed by putting the negative sign before the numeral in the present specification. The inventors obtained the following knowledge and made the present invention as a result of diligent studies as to a structure which improves switching characteristics of a silicon carbide semiconductor device. Firstly, in order to improve the switching characteristics, reducing the electric capacity of a silicon carbide semiconductor device is effective. Of the electric capacity of a silicon carbide semiconductor device, particularly reducing the electric capacity between a gate electrode and a drain electrode is very effective for improvement in the switching characteristics.

As a result of the diligent studies, the inventors discovered that having the following configuration of a first second conductivity type region 21 can improve the switching characteristics of a silicon carbide semiconductor device. A silicon carbide semiconductor device having this configuration has first second conductivity type region 21 being surrounded by a first conductivity type region 86 and having a second conductivity type. An impurity concentration of first second conductivity type region 21 is lower than an impurity concentration of first conductivity type region 86. When viewed in a cross section, and it is provided that a contact point at which a boundary surface between conductivity type region 86 and a body region 82 is in contact with a first side wall surface SW1 is a first contact point C1, and that a contact point at which a boundary surface between first conductivity type region 86 and body region 82 is in contact with a second side wall surface SW2 is a second contact point C2, first second conductivity type region 21 is provided so as to face a region R between first contact point C1 and second contact point C2 and be separated from a first main surface 10b. Accordingly, since an electric line of force entering from a drain electrode into a gate electrode can be directed to an electric line of force entering from the drain electrode into a source electrode, the electric capacity between the gate electrode and the drain electrode can be reduced effectively. Consequently, the switching characteristics of a silicon carbide semiconductor device can be improved.

(1) A silicon carbide semiconductor device in accordance with an embodiment includes a silicon carbide substrate 10, a gate electrode 92, and a drain electrode 98. Silicon carbide substrate 10 has a first main surface 10b and a second main surface 10a opposite to first main surface 10b, and a trench TR is formed in second main surface 10a. Gate electrode 92 is provided in trench TR. Drain electrode 98 is provided in contact with first main surface 10b. Silicon carbide substrate 10 includes a first conductivity type region 86 constituting first main surface 10b and having a first conductivity type, a body region 82 being provided on first conductivity type region 86 and having a second conductivity type which is different from the first conductivity type, a source region 83 being provided on body region 82 so as to be separated apart from the first conductivity type region, constituting second main surface 10a, and having the first conductivity type, and first second conductivity type region 21 being surrounded by first conductivity type region 86 and having the second conductivity type. Trench TR is formed of a side wall surface SW penetrating through source region 83 and body region 82 to reach first conductivity type region 86, and a bottom portion BT being located in first conductivity type region 86. Side wall surface SW has a first side wall surface SW1 and a second side wall surface SW2 facing each other when viewed in a cross section. An impurity concentration of first second conductivity type region 21 is lower than an impurity concentration of first conductivity type region 86. When viewed in a cross section, and it is provided that a contact point at which a boundary surface between first conductivity type region 86 and body region 82 is in contact with first side wall surface SW1 is a first contact point C1, and that a contact point at which a boundary surface between first conductivity type region 86 and body region 82 is in contact with second side wall surface SW2 is a second contact point C2, first second conductivity type region 21 is provided so as to face a region R between first contact point C1 and second contact point C2 and be separated from first main surface 10b.

The silicon carbide semiconductor device in accordance with the above-described embodiment has first second conductivity type region 21 being surrounded by first conductivity type region 86 and having the second conductivity type. The impurity concentration of first second conductivity type region 21 is lower than the impurity concentration of first conductivity type region 86. When viewed in a cross section, and it is provided that a contact point at which a boundary surface between first conductivity type region 86 and body region 82 is in contact with first side wall surface SW1 is first contact point C1, and that a contact point at which a boundary surface between first conductivity type region 86 and body region 82 is in contact with second side wall surface SW2 is second contact point C2, first second conductivity type region 21 is provided so as to face region R between first contact point C1 and second contact point C2 and be separated apart from first main surface 10b. Accordingly, since an electric line of force entering from the drain electrode into the gate electrode can be directed to an electric line of force entering from the drain electrode into the source electrode, the electric capacity between the gate electrode and the drain electrode can be reduced effectively. Consequently, the switching characteristics of the silicon carbide semiconductor device can be improved. Moreover, the impurity concentration of first second conductivity type region 21 is lower than the impurity concentration of first conductivity type region 86. Accordingly, interference with a current path in the case where the transistor is shifted to the on-state is minimized, so that an increase in the on resistance can be suppressed.

(2) In the silicon carbide semiconductor device in accordance with the above-described item (1), preferably, first conductivity type region 86 includes a silicon carbide single-crystal substrate 80 constituting first main surface 10b, having a third main surface opposite to first main surface 10b, and having a first impurity concentration, and a drift region 81 being provided between third main surface 80a of silicon carbide single-crystal substrate 80 and body region 82 and having a second impurity concentration which is lower than the first impurity concentration. Accordingly, the switching characteristics of the silicon carbide semiconductor device having silicon carbide single-crystal substrate 80 and drift region 81 can be improved.

(3) In the silicon carbide semiconductor device in accordance with the above-described item (2), preferably, first second conductivity type region 21 is provided so as to be surrounded by drift region 81, and an impurity concentration of first second conductivity type region 21 is lower than the second impurity concentration. Accordingly, the parasitic capacitance component in the drift region can be reduced by depletion, so that the transient response performance can be improved.

(4) In the silicon carbide semiconductor device in accordance with the above-described item (2), preferably, first second conductivity type region 21 is provided so as to intersect with a plane which is along third main surface 80a of silicon carbide single-crystal substrate 80, and an impurity concentration of first second conductivity type region 21 is lower than the second impurity concentration. Accordingly, current path constriction in the drift region can be suppressed, so that an increase in the on resistance can be suppressed.

(5) In the silicon carbide semiconductor device in accordance with the above-described item (2), preferably, first second conductivity type region 21 is provided so as to be in contact with drift region 81 on a plane which is along third main surface 80a of silicon carbide single-crystal substrate 80, and a region other than the region in contact with drift region 81 is provided so as to be surrounded by silicon carbide single-crystal substrate 80, and an impurity concentration of first second conductivity type region 21 is lower than the first impurity concentration. Accordingly, current path constriction in the drift region can be suppressed, so that increase in the on resistance can be suppressed.

(6) In the silicon carbide semiconductor device in accordance with the above-described item (5), preferably, an impurity concentration of first second conductivity type region 21 is higher than the second impurity concentration. Accordingly, the parasitic capacitance component in the drift region can be reduced by depletion, so that the transient response performance can be improved.

(7) In the silicon carbide semiconductor device in accordance with any one of the above-described items (1) to (6), preferably, silicon carbide substrate 10 further includes a second second conductivity type region 22 located between bottom portion BT of trench TR and first second conductivity type region 21 when viewed in a cross section, and an impurity concentration of second second conductivity type region 22 is higher than an impurity concentration of first conductivity type region 86. Accordingly, concentration of electric field in a boundary portion between bottom portion BT of trench TR and side wall surface SW can be relaxed.

(8) In the silicon carbide semiconductor device in accordance with the above-described item (7), preferably, the impurity concentration of second second conductivity type region 22 is five or more times higher than the impurity concentration of first second conductivity type region 21. Accordingly, concentration of electric field in a boundary portion between bottom portion BT of trench TR and side wall surface SW can be relaxed.

(9) In the silicon carbide semiconductor device in accordance with any one of the above-described items (1) to (8), preferably, a ratio obtained by dividing a width W2 of first second conductivity type region 21 along a direction parallel to first main surface 10b by a width W1 of a region connecting first contact point C1 and second contact point C2 when viewed in a cross section is greater than or equal to 0.8 and less than or equal to 1.2. Setting the ratio to be greater than or equal to 0.8 sufficiently reduces the electric capacity between gate electrode 92 and drain electrode 98, so that the switching characteristics of the silicon carbide semiconductor device can be improved effectively. Setting the ratio to be less than or equal to 1.2 can suppress an increase in the on resistance of the silicon carbide semiconductor device.

(10) A method for manufacturing a silicon carbide semiconductor device in accordance with an embodiment includes the following steps. Silicon carbide substrate 10 having a first main surface 10b and a second main surface 10a opposite to first main surface 10b and having a trench TR formed in second main surface 10a is prepared. A gate electrode 92 is formed in trench TR. Drain electrode 98 is formed in contact with first main surface 10b. Silicon carbide substrate 10 includes a first conductivity type region 86 constituting first main surface 10b and having a first conductivity type, a body region 82 being provided on first conductivity type region 86 and having a second conductivity type which is different from the first conductivity type, a source region 83 being provided on body region 82 so as to be separated apart from first conductivity type region 86, constituting second main surface 10a, and having the first conductivity type, and a first second conductivity type region 21 being surrounded by first conductivity type region 86 and having the second conductivity type. Trench TR is formed of a side wall surface SW penetrating through source region 83 and body region 82 to reach first conductivity type region 86, and a bottom portion BT located in first conductivity type region 86, and side wall surface SW has first a side wall surface SW1 and a second side wall surface SW2 facing each other when viewed in a cross section, and an impurity concentration of first second conductivity type region 21 is lower than an impurity concentration of first conductivity type region 86. When viewed in a cross section, and it is provided that a contact point at which a boundary surface between first conductivity type region 86 and body region 82 is in contact with first side wall surface SW1 is a first contact point C1, and that a contact point at which a boundary surface between first conductivity type region 86 and body region 82 is in contact with second side wall surface SW2 is a second contact point C2, first second conductivity type region 21 is provided so as to face a region R between first contact point C1 and second contact point C2 and be separated from first main surface 10b. Accordingly, since the electric capacity between gate electrode 92 and drain electrode 98 can be reduced effectively, the switching characteristics of the silicon carbide semiconductor device can be improved.

(11) In the method for manufacturing a silicon carbide semiconductor device in accordance with the above-described item (10), preferably, the step of preparing a silicon carbide substrate includes the step of forming first conductivity type region 86 constituting first main surface 10b and having the first conductivity type. The step of forming first conductivity type region 86 has the step of preparing silicon a carbide single-crystal substrate 80 constituting first main surface 10b, having a third main surface 80a opposite to first main surface 10b, and having a first impurity concentration, and the step of forming a drift region 81 being in contact with third main surface 80a of silicon carbide single-crystal substrate 80 and having a second impurity concentration which is lower than the first impurity concentration. Accordingly, the switching characteristics of the silicon carbide semiconductor device having silicon carbide single-crystal substrate 80 and drift region 81 can be improved.

(12) In the method for manufacturing a silicon carbide semiconductor device in accordance with the above-described item (11), preferably, the step of preparing silicon carbide substrate 10 includes the step of forming first second conductivity type region 21 by conducting ion implantation with respect to at least silicon carbide single-crystal substrate 80. Accordingly, first second conductivity type region 21 in contact with at least silicon carbide single-crystal substrate 80 can be formed.

(13) In the method for manufacturing a silicon carbide semiconductor device in accordance with the above-described item (12), preferably, the step of preparing silicon carbide substrate 10 includes, after the step of preparing silicon carbide single-crystal substrate 80 and before the step of forming drift region 81, the step of forming first second conductivity type region 21 by conducting ion implantation from a side of third main surface 80a of silicon carbide single-crystal substrate 80. Accordingly, first second conductivity type region 21 located near third main surface 80a of silicon carbide single-crystal substrate 80 can be formed.

(14) In the method for manufacturing a silicon carbide semiconductor device in accordance with the above-described item (12), preferably, the step of preparing a silicon carbide substrate includes the step of forming the first second conductivity type region by conducting ion implantation from a side of the first main surface of the silicon carbide single-crystal substrate. Accordingly, first second conductivity type region 21 located near first main surface 10b of silicon carbide single-crystal substrate 80 can be formed.

(15) In the method for manufacturing a silicon carbide semiconductor device in accordance with the above-described item (14), preferably, the step of preparing a silicon carbide substrate includes the step of polishing the silicon carbide single-crystal substrate on a side of the first main surface. The first second conductivity type region is formed by conducting ion implantation from a side of the first main surface of the silicon carbide single-crystal substrate after the step of polishing the first main surface side of the silicon carbide single-crystal substrate. Accordingly, since silicon carbide single-crystal substrate 80 is thinned, the ion implantation depth can be small.

(16) In the method for manufacturing a silicon carbide semiconductor device in accordance with any one of the above-described items (10) to (15), preferably, the silicon carbide substrate further includes second second conductivity type region 22 located between the bottom portion of the trench and the first second conductivity region when viewed in a cross section. An impurity concentration of the second second conductivity type region is higher than an impurity concentration of the first conductivity type region. Accordingly, concentration of electric field in a boundary portion between bottom portion BT of trench TR and side wall surface SW can be relaxed.

(17) In the method for manufacturing a silicon carbide semiconductor device in accordance with the above-described item (16), preferably, an impurity concentration of the second second conductivity type region is five or more times higher than an impurity concentration of the first conductivity type region. Accordingly, concentration of electric field in a boundary portion between bottom portion BT of trench TR and side wall surface SW can be relaxed.

(18) In the method for manufacturing a silicon carbide semiconductor device in accordance with any one of the above-described items (10) to (17), preferably, a ratio obtained by dividing a width W2 of the first second conductivity type region along a direction parallel to the first main surface by a width W1 of a region connecting the first contact point and the second contact point when viewed in a cross section is greater than or equal to 0.8 and less than or equal to 1.2. Setting the ratio to be greater than or equal to 0.8 sufficiently reduces the electric capacity between gate electrode 92 and drain electrode 98, so that the switching characteristics of the silicon carbide semiconductor device can be improved effectively. Setting the ratio to be less than or equal to 1.2 can suppress an increase in the on resistance of the silicon carbide semiconductor device.

DETAILS OF EMBODIMENTS OF THE PRESENT INVENTION

First Embodiment

Referring to FIGS. 1 to 4, a structure of a MOSFET as a silicon carbide semiconductor device in accordance with the first embodiment of the present invention will be described. MOSFET 1 in accordance with the first embodiment mainly has a silicon carbide substrate 10, a gate insulating film 91, a gate electrode 92, an interlayer insulating film 93, a source electrode 94, a source interconnection layer 95, and a drain electrode 98. Silicon carbide substrate 10 is made of, for example, hexagonal crystal silicon carbide having polytype 4H, and has a first main surface 10b and a second main surface 10a opposite to first main surface 10b. First main surface 10b of silicon carbide substrate 10 is, for example, a {000-1} plane, and is preferably a plane having an angle of less than or equal to 8° with respect to the {000-1} plane. Silicon carbide substrate 10 mainly includes an n-type region 86 (first conductivity type region), a body region 82, a source region 83, a contact region 84, and a first p-type region 21 (first second conductivity type region).

N-type region 86 constitutes first main surface 10b of silicon carbide substrate 10. N-type region 86 contains impurities such as nitrogen and has the n-type (first conductivity type). Preferably, n-type region 86 includes a silicon carbide single-crystal substrate 80 having a third main surface 80a opposite to first main surface 10b of silicon carbide substrate 10 and having a first impurity concentration, and a drift region 81 provided between third main surface 80a of silicon carbide single-crystal substrate 80 and body region 82 and having a second impurity concentration which is lower than the first impurity concentration.

Drift region 81 contains impurities such as nitrogen or phosphorus, and has the n-type (first conductivity type). The impurity concentration of drift region 81 is lower than the impurity concentration of silicon carbide single-crystal substrate 80. The impurity concentration (donor concentration) of drift region 81 is preferably higher than or equal to $1 \times 10^{15}$ cm$^{-3}$ and lower than or equal to $5 \times 10^{16}$ cm$^{-3}$, which is, for example, $8 \times 10^{15}$ cm$^{-3}$. The thickness of drift region 81 is, for example, about 15 μm. The impurity concentration of silicon carbide single-crystal substrate 80 is, for example, about $1 \times 10^{18}$ cm$^{-3}$.

Body region 82 contains impurities such as aluminum, and has the p-type (second conductivity type). Body region 82 is provided on n-type region 86, more particularly on drift region 81. The impurity concentration of body region 82 is higher than the impurity concentration of drift region 81. The impurity concentration of body region 82 is preferably higher than or equal to $1 \times 10^{17}$ cm$^{-3}$ and lower than or equal to $5 \times 10^{18}$ cm$^{-3}$, which is, for example, $1 \times 10^{18}$ cm$^{-3}$.

Source region 83 contains impurities such as phosphorus, and has the n-type. Source region 83 is provided on body region 82 so as to be separated apart from n-type region 86 by body region 82, and constitutes second main surface 10a of silicon carbide substrate 10. The impurity concentration of source region 83 is higher than the impurity concentration of drift region 81. Source region 83 together with contact region 84 forms second main surface 10a of silicon carbide substrate 10. Contact region 84 contains impurities such as aluminum, and has the p-type. The impurity concentration of contact region 84 is higher than the impurity concentration of body region 82. Contact region 84 is in contact with source region 83 so as to be surrounded by source region 83, and is connected to body region 82.

First p-type region 21 is formed so as to be surrounded by n-type region 86. First p-type region 21 contains impurities such as aluminum, and has the p-type. The impurity concentration of first p-type region 21 is lower than the impurity concentration of n-type region 86. In MOSFET 1 in accordance with the first embodiment, first p-type region 21 is provided so as to be in contact with drift region 81 on a plane along third main surface 80a of silicon carbide single-crystal substrate 80, and a region other than the region in contact with drift region 81 is provided so as to be surrounded by silicon carbide single-crystal substrate 80. The impurity concentration of first p-type region 21 is lower than the impurity concentration (first impurity concentration) of silicon carbide single-crystal substrate 80. The impurity concentration of first p-type region 21 is, for example, higher than or equal to $4 \times 10^{15}$ cm$^{-3}$, and is preferably about higher than or equal to $1 \times 10^{16}$ cm$^{-3}$ and lower than or equal to $10^{17}$ cm$^{-3}$. Preferably, the impurity concentration of first p-type region 21 is lower than the impurity concentration (first impurity concentration) of silicon carbide single-crystal substrate 80 and higher than the impurity concentration (second impurity concentration) of drift region 81. The impurity concentration of first p-type region 21 may be lower than the impurity concentration of drift region 81. The thickness of first p-type region 21 is, for example, about 0.5 µm.

Trench TR is formed in second main surface 10a of silicon carbide substrate 10. Trench TR is formed of a side wall surface SW penetrating through source region 83 and body region 82 to reach n-type region 86, and a bottom portion BT located in the n-type region. Bottom portion BT is connected to side wall surface SW. Side wall surface SW of trench TR has a first side wall surface SW1 and a second side wall surface SW2 which are opposite to each other in a cross section (viewed in a direction parallel to first main surface 10b). Preferably, first side wall surface SW1 and second side wall surface SW2 are in line symmetry with respect to a normal line of first main surface 10b. Each of first side wall surface SW1 and second side wall surface SW2 is tilted with respect to second main surface 10a of silicon carbide substrate 10, so that trench TR is widened in a tapered manner toward an opening. The plane orientation of first side wall surface SW1 and second side wall surface SW2 is preferably tilted with respect to a {0001} plane at an angle of greater than or equal to 50° and less than or equal to 65°, more preferably tilted with respect to a (000-1) plane at an angle of greater than or equal to 50° and less than or equal to 65°.

Preferably, first side wall surface SW1 and second side wall surface SW2 have a predetermined special plane especially at a portion on body region 82. First side wall surface SW1 and second side wall surface SW2 having the special plane have a first plane including a plane orientation {0-33-8}. In other words, a surface including the first plane is provided in body region 82 on side wall surface SW of trench TR. The first plane preferably has a plane orientation (0-33-8). More preferably, first side wall surface SW1 and second side wall surface SW2 include the first plane microscopically, and first side wall surface SW1 and second side wall surface SW2 further include a second plane having a plane orientation {0-11-1} microscopically. The term "microscopically" means it is in detail to the extent of considering at least the size of about two times the inter-atomic spacing. As a method for observing such a microscopic structure, a TEM (Transmission Electron Microscope) can be used, for example. The second plane preferably has a plane orientation (0-11-1).

Preferably, the first plane and the second plane of first side wall surface SW1 and second side wall surface SW2 constitute a combined plane having a plane orientation {0-11-2}. In other words, the combined plane is configured by periodical repetition of the first plane and the second plane. Such a periodical structure can be observed, for example, with the TEM or an AFM (Atomic Force Microscopy). In this case, the combined plane has an off angle of 62° with respect to the {000-1} macroscopically. Herein, the term "macroscopically" means that a fine structure having the size as small as that of inter-atomic spacing is disregarded. For the measurement of such a macroscopic off angle, a general method using the X-ray diffraction can be used. Preferably, the combined plane has a plane orientation (0-11-2). In this case, the combined plane has an off angle of 62° with respect to the (000-1) plane macroscopically.

Figure 2:
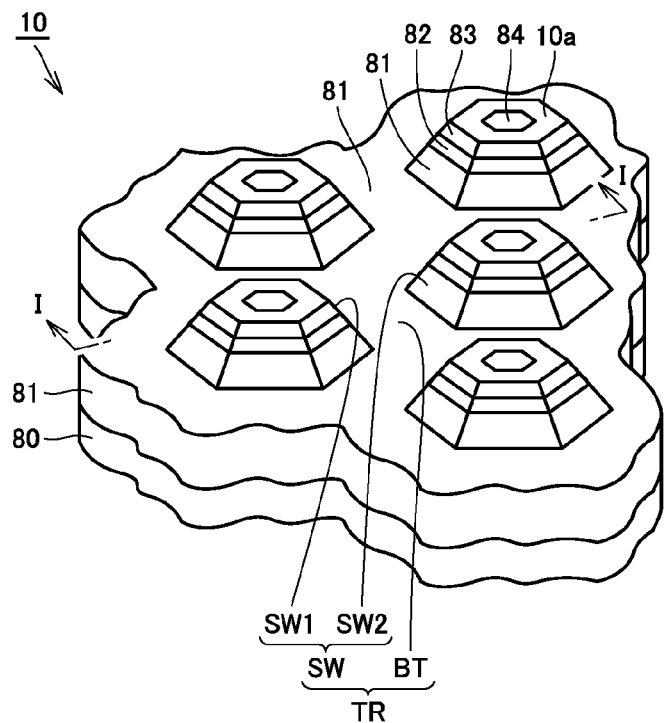
FIG. 2 is a perspective schematic view schematically showing a configuration of a silicon carbide substrate of the silicon carbide semiconductor device in accordance with the first embodiment of the present invention.

Referring to FIG. 2, trench TR formed in second main surface 10a of silicon carbide substrate 10 has first side wall surface SW1, second side wall surface SW2, and bottom portion BT. Each of first side wall surface SW1 and second side wall surface SW2 of trench TR is formed of drift region 81, body region 82, and source region 83, and bottom portion BT of trench TR is formed of drift region 81. Source region 83 and contact region 84 are exposed from second main surface 10a of silicon carbide substrate 10.

Referring again to FIG. 1, when viewed in a cross section, and it is provided that a contact point at which a boundary surface between n-type region 86 and body region 82 is in contact with first side wall surface SW1 of trench TR is a first contact point C1, and that a contact point at which a boundary surface between n-type region 86 and body region 82 is in contact with second side wall surface SW2 of trench TR is a second contact point C2, first p-type region 21 is provided so as to face a region R between first contact point C1 and second contact point C2 and be separated from first main surface 10b of silicon carbide substrate 10. Preferably, a ratio obtained by dividing a width W2 of first p-type region 21 along a direction parallel to first main surface 10b of silicon carbide substrate 10 by a width W1 of region R connecting first contact point C1 and second contact point C2 when viewed in a cross section is greater than or equal to 0.8 and less than or equal to 1.2.

Figure 3:
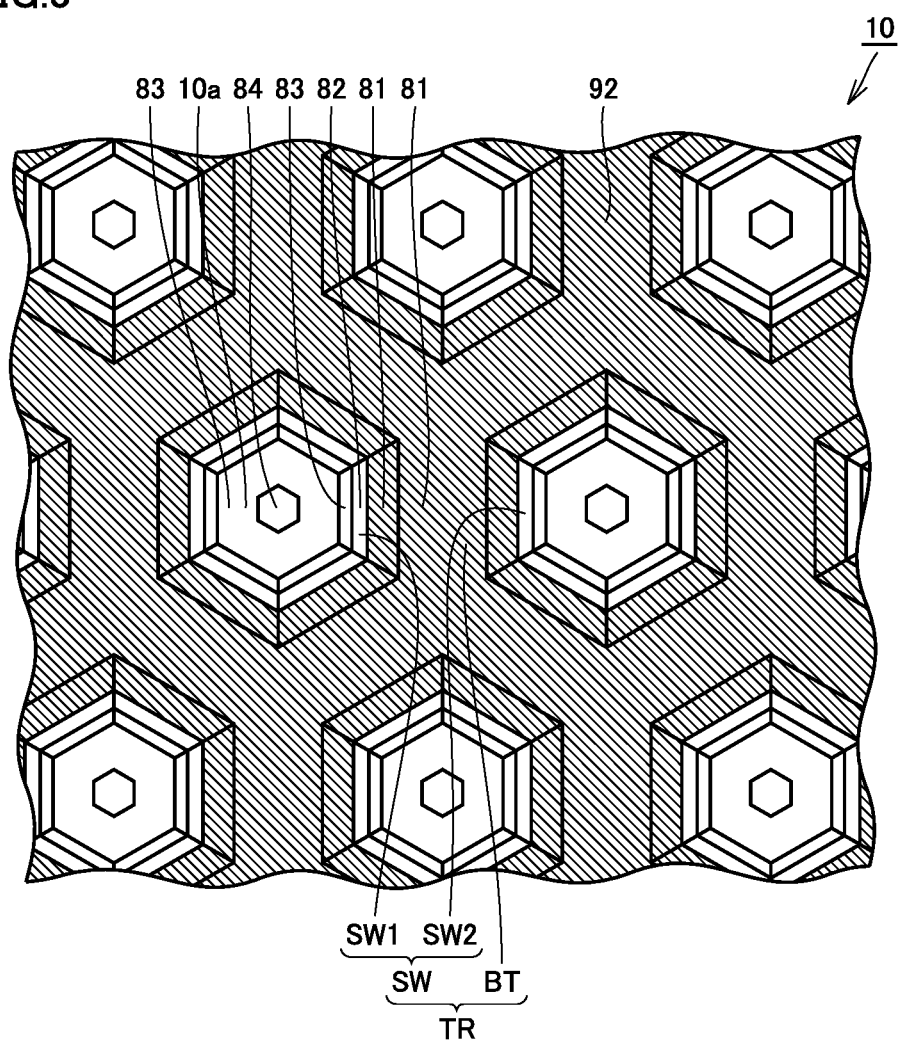
FIG. 3 is a schematic plan view schematically showing a configuration of the region III-III of FIG. 1.

Referring to FIG. 3, a planar shape of region R between first contact point C1 and second contact point C2 will be described. In a plan view (viewed along a normal line direction of first main surface 10b), region R between first contact point C1 and second contact point C2 is a region configured to form a mesh having a honeycomb structure. Bottom portion BT of trench TR is configured to form a mesh having a honeycomb structure in a plan view. In a plan view, the shape of an outer edge of each of body region 82, source region 83, and contact region 84 is a hexagon.

Figure 4:
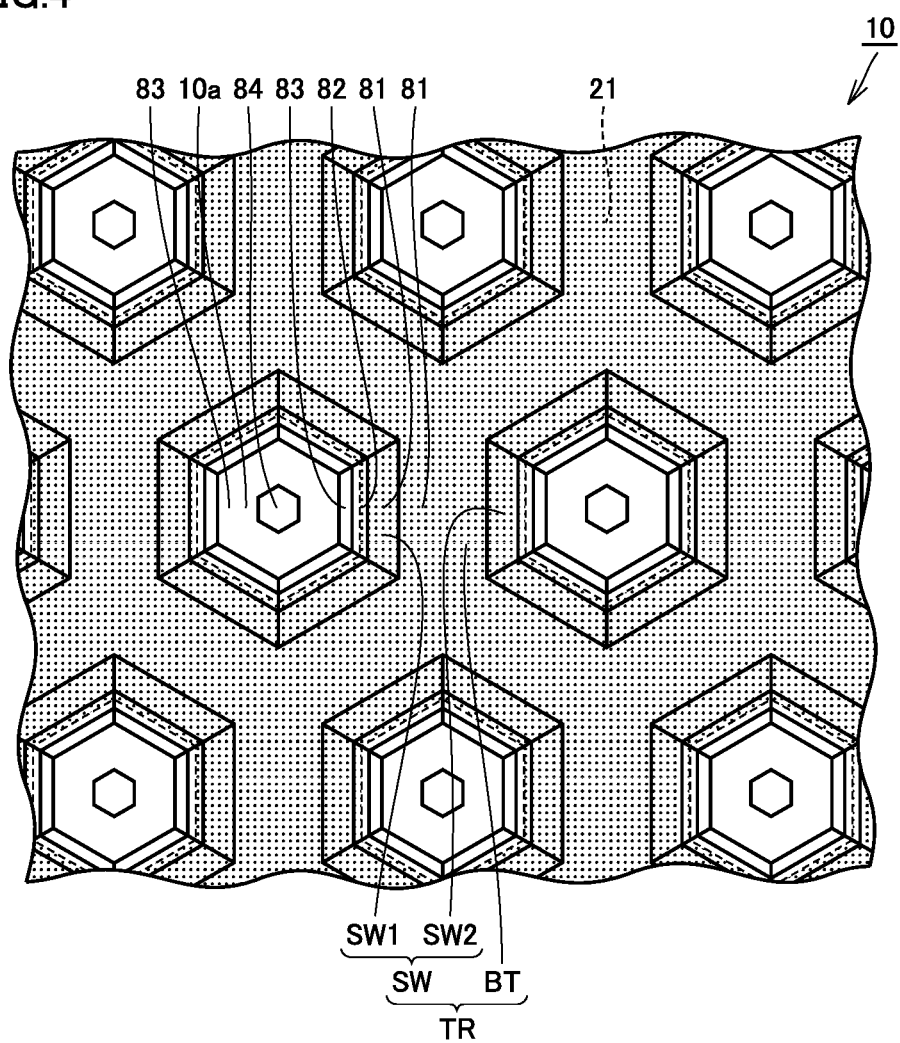
FIG. 4 is a schematic plan view schematically showing a configuration of the region IV-IV of FIG. 1.

Referring to FIG. 4, the planar shape of first p-type region 21 will be described. In FIG. 4, portions surrounded by broken lines are first p-type regions 21. In a plan view, first p-type regions 21 are configured to form a mesh having a honeycomb structure. In a plan view, first p-type regions 21 are formed so that all or some of first p-type regions 21 overlap with regions R between first contact point C1 and second contact point C2. In a plan view, first p-type regions 21 may be formed so that regions R between first contact point C1 and second contact point C2 entirely overlap with first p-type regions 21.

Referring to FIG. 1, gate insulating film 91 covers each of first side wall surface SW1, second side wall surface SW2, and bottom portion BT of trench TR. Accordingly, gate insulating film 91 is provided on body region 82 so as to connect source region 83 and drift region 81.

Gate electrode 92 is provided in trench TR, and is provided in contact with gate insulating film 91. Gate electrode 92 is provided so as to face source region 83, body region 82, and drift region 81 through gate insulating film 91. Gate electrode 92 is made of, for example, polysilicon doped with impurities.

Source electrode 94 is in contact with each of source region 83 and contact region 84. Source interconnection layer 95 is in contact with source electrode 94. Source interconnection layer 95 is, for example, an aluminum layer. Interlayer insulating film 93 is connected to gate electrode 92, gate insulating film 91, and source electrode 94, and provides electrical insulation between gate electrode 92 and source interconnection layer 95.

Next, a method for manufacturing MOSFET 1 in accordance with the first embodiment will be described.

Figure 5:
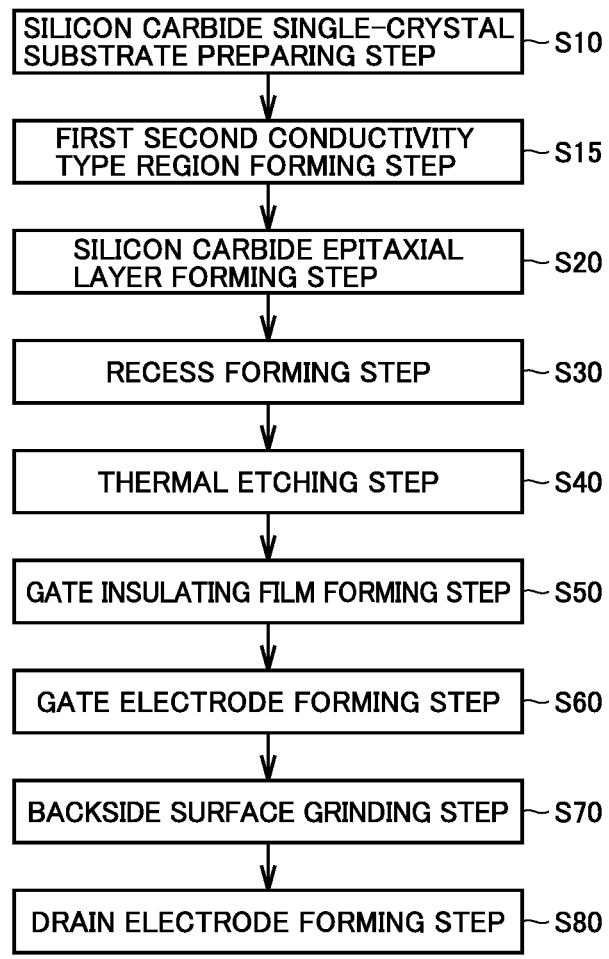
FIG. 5 is a flowchart schematically showing a method for manufacturing the silicon carbide semiconductor device in accordance with the first embodiment of the present invention.

Firstly, the silicon carbide single-crystal substrate preparing step (S10: FIG. 5) is performed. Silicon carbide single-crystal substrate 80 having first main surface 10b and second main surface 10a opposite to first main surface 10b and having polytype 4H is prepared, for example, by slicing an ingot made of hexagonal crystal silicon carbide through a sublimation method.

Figure 6:
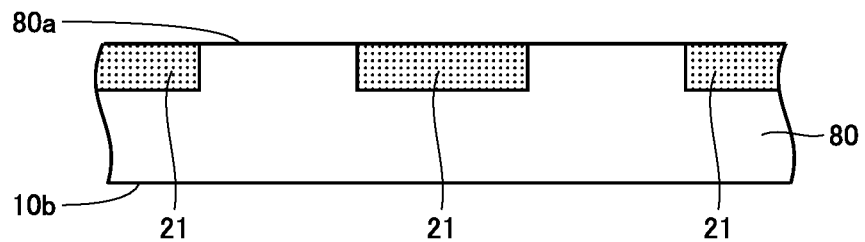
FIG. 6 is a schematic cross sectional view schematically showing a first step of the method for manufacturing the silicon carbide semiconductor device in accordance with the first embodiment of the present invention.
Figure 24:
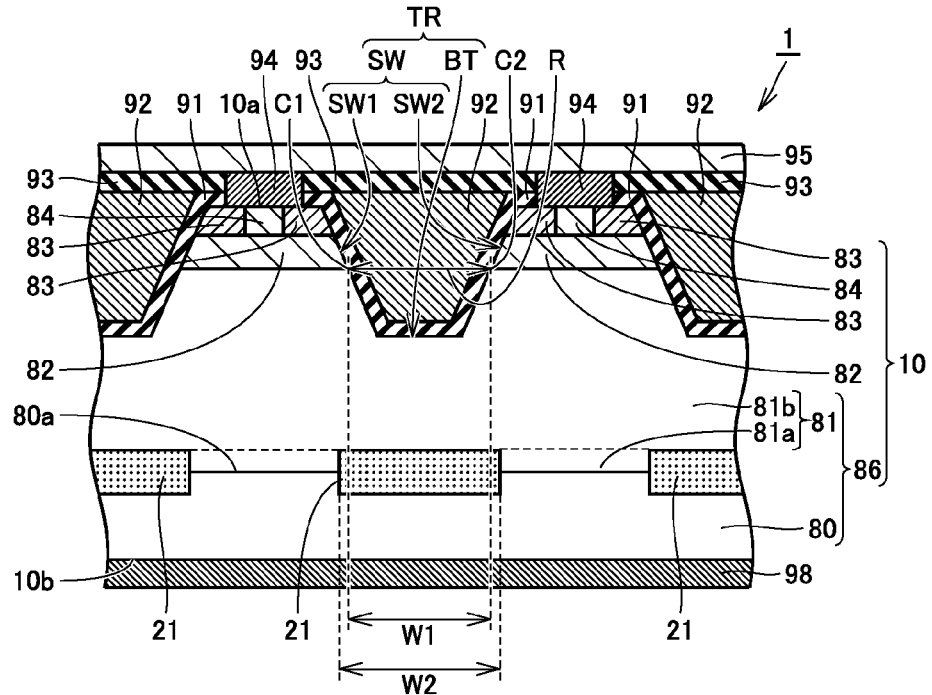
FIG. 24 is a schematic cross sectional view schematically showing a configuration of a silicon carbide semiconductor device in accordance with a third embodiment of the present invention.

Next, the first second conductivity type region forming step (S15: FIG. 5) is performed. Referring to FIG. 6, for example, first p-type region 21 which is partially exposed from third main surface 80a of silicon carbide single-crystal substrate 80 is formed, for example, by conducting ion implantation of impurities such as aluminum from a side of the third main surface 80a of silicon carbide single-crystal substrate 80. First p-type region 21 is formed by conducting ion implantation with respect to at least silicon carbide single-crystal substrate 80. In other words, first p-type region 21 may be formed by conducting ion implantation with respect to only silicon carbide single-crystal substrate 80 as shown in FIG. 6, or may be formed by conducting ion implantation with respect to silicon carbide single-crystal substrate 80 and drift layer 81 as shown in FIG. 24.

Next, the silicon carbide epitaxial layer forming step (S20: FIG. 5) is performed. An epitaxial layer made of silicon carbide is formed on silicon carbide single-crystal substrate 80. Specifically, drift region 81 is formed by an epitaxial growth on silicon carbide single-crystal substrate 80. The epitaxial growth can be performed by a CVD (Chemical Vapor Deposition) method using, for example, mixed gas of silane ($SiH_4$) and propane ($C_3H_8$) as source gas and using, for example, hydrogen gas ($H_2$) as carrier gas. It is preferable to introduce, for example, nitrogen (N) or phosphorus (P) as impurities into drift region 81.

Figure 7:
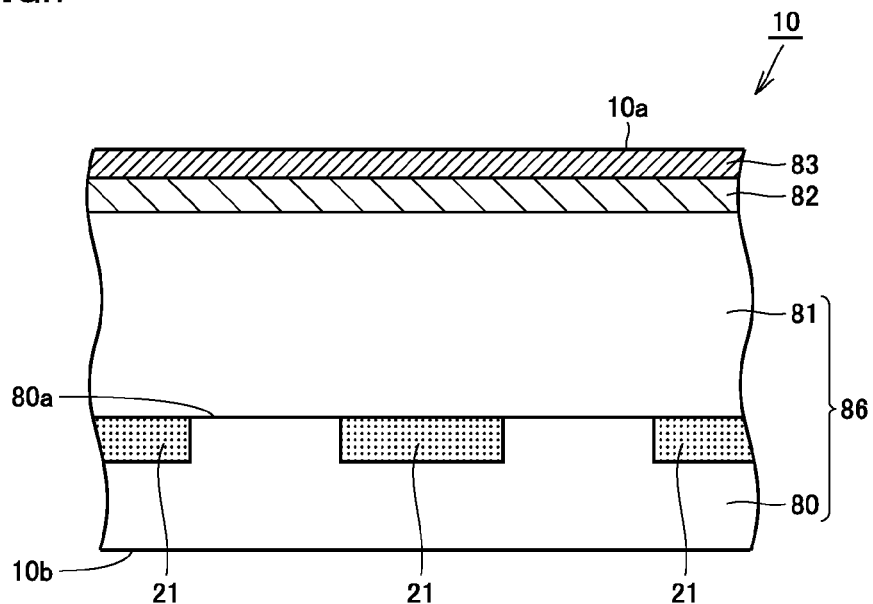
FIG. 7 is a schematic cross sectional view schematically showing a second step of the method for manufacturing the silicon carbide semiconductor device in accordance with the first embodiment of the present invention.

As shown in FIG. 7, body region 82 and source region 83 are formed on drift region 81. Body region 82 and source region 83 can be formed by, for example, ion implantation with respect to drift region 81. In the ion implantation for forming body region 82, ion implantation of impurities such as aluminum for giving the p-type is conducted. An implantation depth of the impurities is, for example, about greater than or equal to 0.7 μm and less than or equal to 0.8 μm. Moreover, in the ion implantation for forming source region 83, ion implantation of impurities such as phosphorus for giving the n-type is conducted. It should be noted that, in place of the ion implantation, an epitaxial growth with addition of impurities may be used. Source region 83 forms second main surface 10a of silicon carbide substrate 10.

Figure 8:
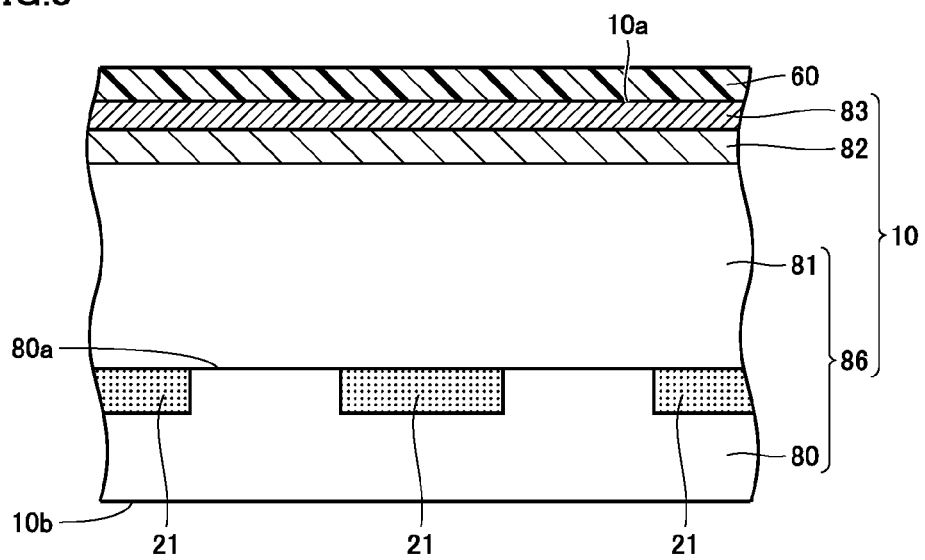
FIG. 8 is a schematic cross sectional view schematically showing a third step of the method for manufacturing the silicon carbide semiconductor device in accordance with the first embodiment of the present invention.
Figure 9:
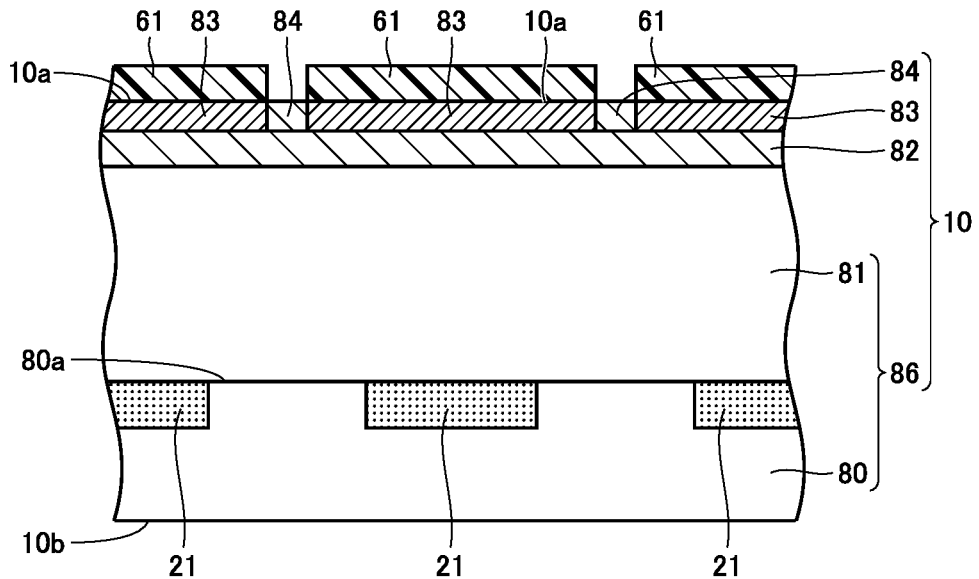
FIG. 9 is a schematic cross sectional view schematically showing a fourth step of the method for manufacturing the silicon carbide semiconductor device in accordance with the first embodiment of the present invention.
Figure 10:
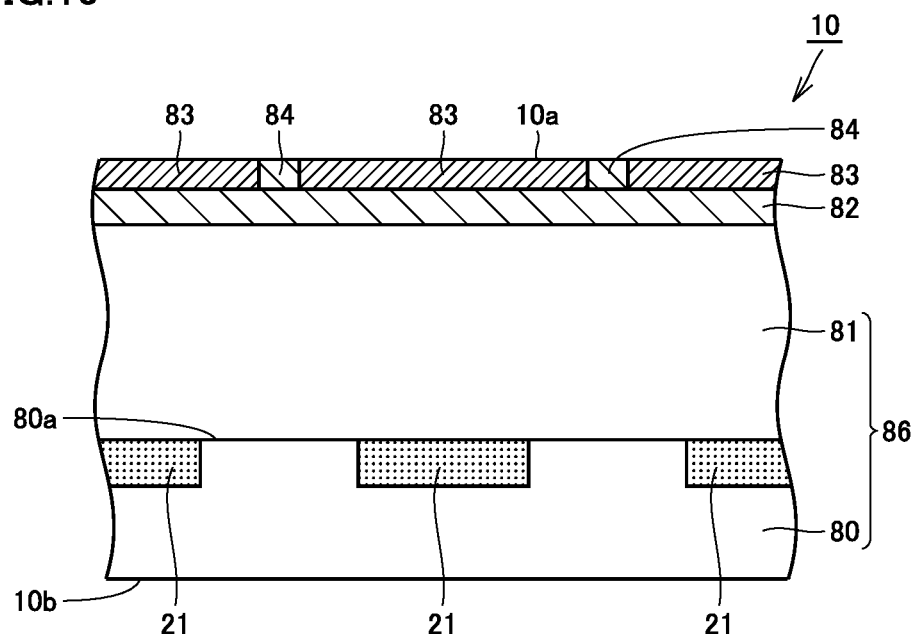
FIG. 10 is a schematic cross sectional view schematically showing a fifth step of the method for manufacturing the silicon carbide semiconductor device in accordance with the first embodiment of the present invention.

Referring to FIG. 8, for example, a mask layer 60 made of a resist is formed on second main surface 10a of silicon carbide substrate 10. Referring to FIG. 9, mask layer 60 is etched so as to form an opening in a region where contact region 84 is formed. Next, with use of mask layer 60, for example, aluminum is implanted to silicon carbide substrate 10 from a side of second main surface 10a, so that contact region 84 is formed. Referring to FIG. 10, mask layer 61 is removed by etching.

Next, a heat treatment for activating impurities is performed. The temperature of this heat treatment is preferably higher than or equal to 1500° C. and lower than or equal to 1900° C., which is for example about 1700° C. The time period of the heat treatment is, for example, about 30 minutes. The atmosphere of the heat treatment is preferably the inert gas atmosphere, which is for example the Ar atmosphere.

Figure 11:
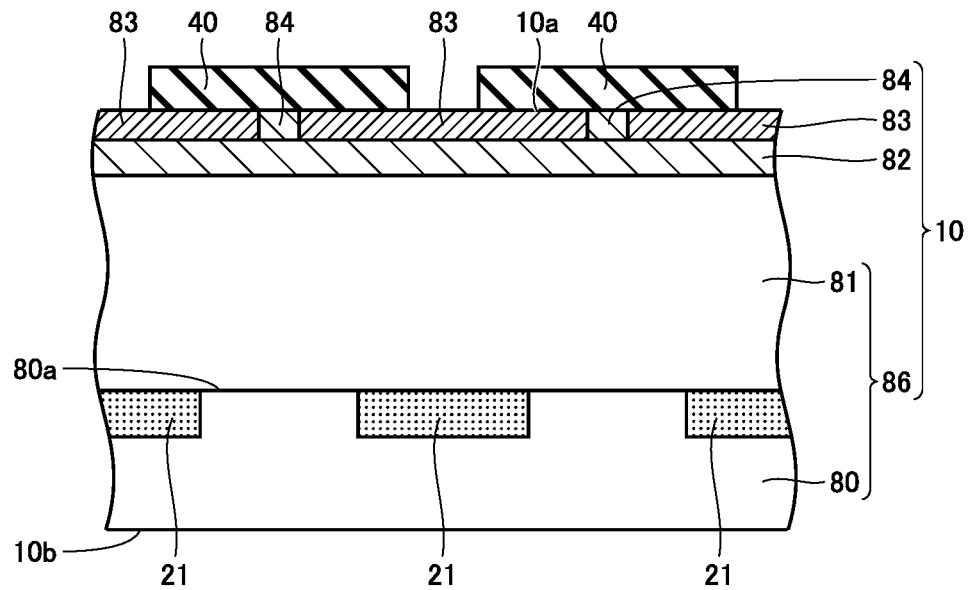
FIG. 11 is a schematic cross sectional view schematically showing a sixth step of the method for manufacturing the silicon carbide semiconductor device in accordance with the first embodiment of the present invention.

Referring to FIG. 11, a mask layer 40 having openings is formed on a plane constituted of source region 83 and contact region 84. As mask layer 40, a silicon oxide film or the like can be used. The openings are formed so as to correspond to positions of trenches TR (FIG. 1).

Figure 12:
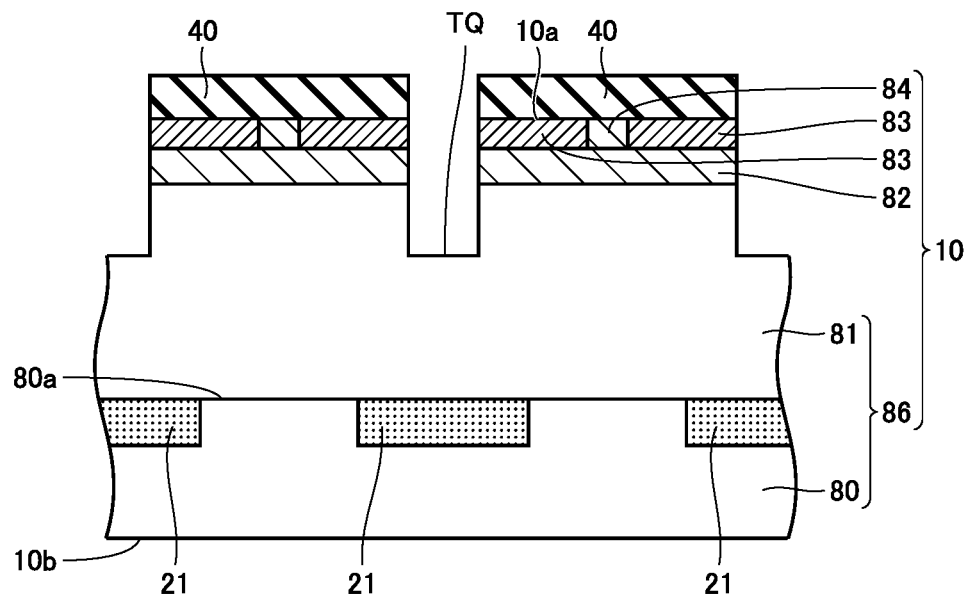
FIG. 12 is a schematic cross sectional view schematically showing a seventh step of the method for manufacturing the silicon carbide semiconductor device in accordance with the first embodiment of the present invention.

Next, the recess forming step (S30: FIG. 5) is performed. Referring to FIG. 12, source region 83, body region 82, and a part of drift region 81 are removed by etching at the openings of mask layer 40. As the method for etching, for example, the reactive ion etching (RIE), particularly the inductive coupled plasma RIE can be used. Specifically, the ICP-RIE with, for example, $SF_6$ or mixed gas of $SF_6$ and $O_2$ as reactive gas can be used. With such etching, a recess TQ having a side wall which is substantially vertical with respect to second main surface 10a of silicon carbide substrate 10 is formed in a region where trench TR (FIG. 1) should be formed.

Next, the thermal etching step (S40: FIG. 5) is performed. The thermal etching can be performed, for example, by heating in the atmosphere containing reactive gas having at least one kind of halogen atom. The at least one kind of halogen atom includes at least one of chlorine (Cl) atom and fluoride (F) atom. This atmosphere is, for example, $Cl_2$, $BCL_3$, $SF_6$, or $CF_4$. For example, thermal etching is performed with mixed gas of chlorine gas and oxygen gas as reactive gas at the heat treatment temperature of, for example, higher than or equal to 700° C. and lower than or equal to 1000° C.

It should be noted that the reactive gas may contain carrier gas in addition to the above-described chlorine gas and oxygen gas. For example, nitrogen ($N_2$) gas, argon gas, and helium gas can be used as the carrier gas. Then, when the heat treatment temperature is set to be higher than or equal to 700° C. and lower than or equal to 1000° C. as described above, the etching speed of SiC becomes, for example, about 70 μm/h. Moreover, in this case, since mask layer 40 made from silicon oxide has an extremely great selection ratio with respect to SiC, it is not substantially etched during etching of SiC.

Figure 13:
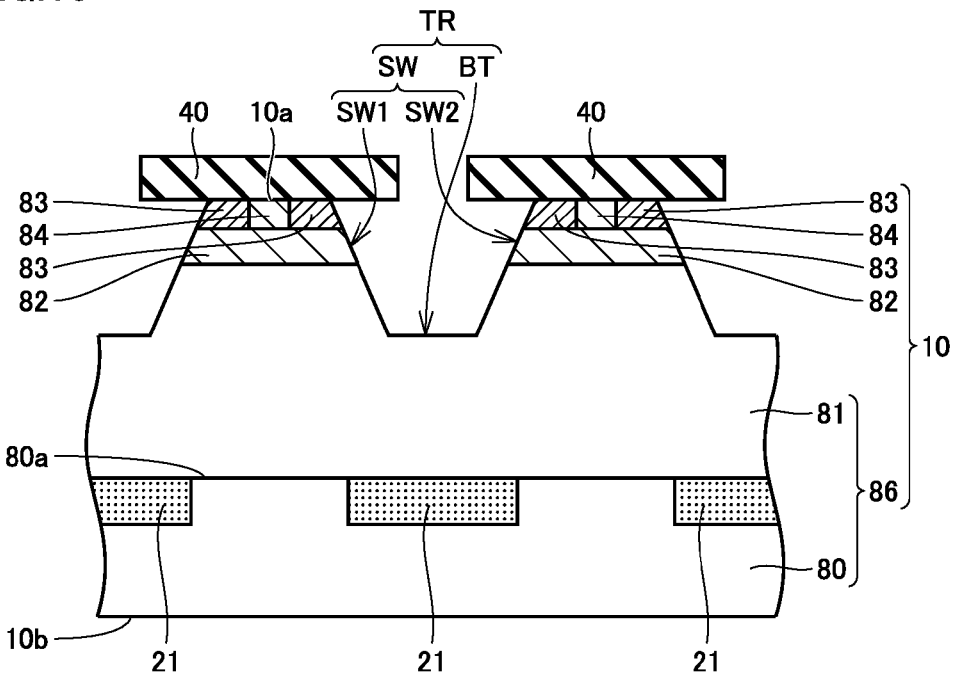
FIG. 13 is a schematic cross sectional view schematically showing an eighth step of the method for manufacturing the silicon carbide semiconductor device in accordance with the first embodiment of the present invention.

Referring to FIG. 13, trenches TR are formed in second main surface 10a of silicon carbide substrate 10 by the above-described thermal etching. Trench TR has side wall surface SW penetrating through source region 83 and body region 82 to reach drift region 81, and bottom portion BT located on drift region 81. Preferably, at the time of forming trenches TR, the special plane is self-formed on side wall surface SW, particularly on body region 82. Side wall surface SW has first side wall surface SW1 and second side wall surface SW2 facing each other when viewed in a cross section.

When viewed in a cross section, and it is provided that a contact point at which a boundary surface of n-type region 86 and body region 82 is in contact with first side wall surface SW1 of trench TR is first contact point C1, and that a contact point at which a boundary surface between n-type region 86 and body region 82 is in contact with second side wall surface SW2 of trench TR is second contact point C2, first p-type region 21 is provided so as to face region R (refer to FIG. 1) between first contact point C1 and second contact point C2 and be separated from first main surface 10b of silicon carbide substrate 10. Preferably, a ratio obtained by dividing width W2 of first p-type region 21 along a direction parallel to first main surface 10b of silicon substrate 10 by width W1 of region R connecting first contact point C1 and second contact point C2 is greater than or equal to 0.8 and less than or equal to 1.2 (refer to FIG. 1). Next, mask layer 40 is removed by any method such as etching.

Figure 14:
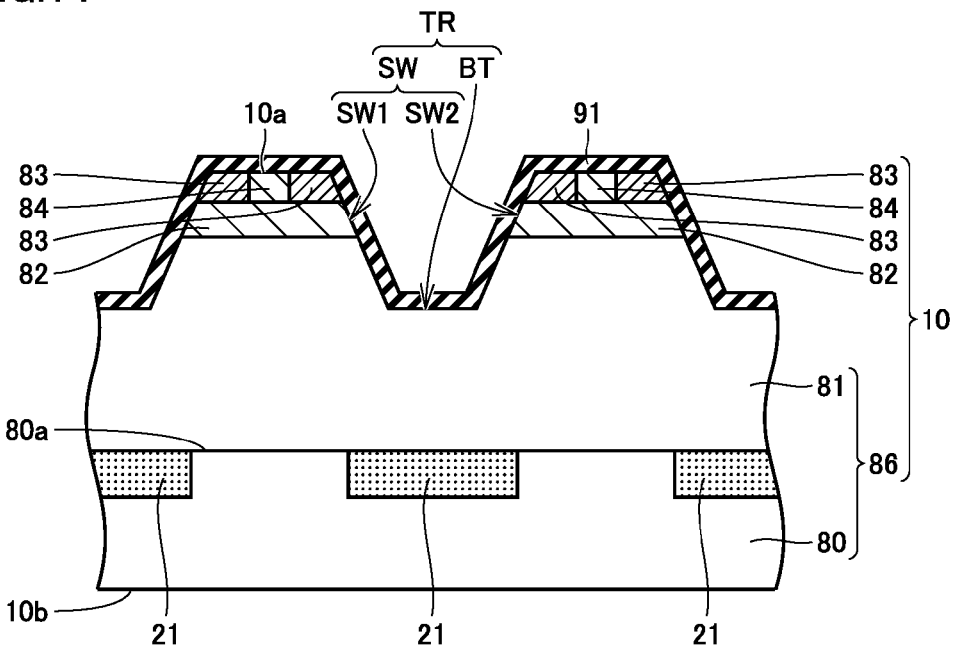
FIG. 14 is a schematic cross sectional view schematically showing a ninth step of the method for manufacturing the silicon carbide semiconductor device in accordance with the first embodiment of the present invention.

Next, the gate insulating film forming step (S50: FIG. 5) is performed. Referring to FIG. 14, gate insulating film 91 covering each of side wall surface SW and bottom portion BT of trench TR is formed. Gate insulating film 91 is formed by, for example, thermal oxidation. Specifically, gate insulating film 91 is in contact with source region 83 and contact region 84 in second main surface 10a of silicon carbide substrate 10, and is in contact with source region 83, body region 82, and drift region 81 at each of first side wall surface SW1 and second side wall surface SW2 of trench TR.

Next, NO annealing with use of nitrogen monoxide (NO) as atmospheric gas may be performed. The temperature profile has the conditions including, for example, the temperature of higher than or equal to 1100° C. and lower than or equal to 1300° C. and the retention time of about 1 hour. Accordingly, nitrogen atoms are introduced into an interface region between gate insulating film 91 and body region 82. Consequently, formation of the interface state in the interface region is suppressed, so that the channel mobility can be improved. It should be noted that, as long as such introduction of nitrogen atoms is possible, gas other than the NO gas may be used as the atmospheric gas. After this NO annealing, Ar annealing with use of argon (Ar) as the atmospheric gas may be performed. The heating temperature of the Ar annealing is preferably equal to or higher than the heating temperature of the above-described NO annealing, and lower than a melting point of gate insulating film 91. The time period of retaining this heating temperature is, for example, about 1 hour. Accordingly, formation of the interface state in the interface region between gate insulating film 91 and body region 82 can be further suppressed. It should be noted that, as the atmospheric gas, other inert gas such as nitrogen gas may be used in place of the Ar gas.

Figure 15:
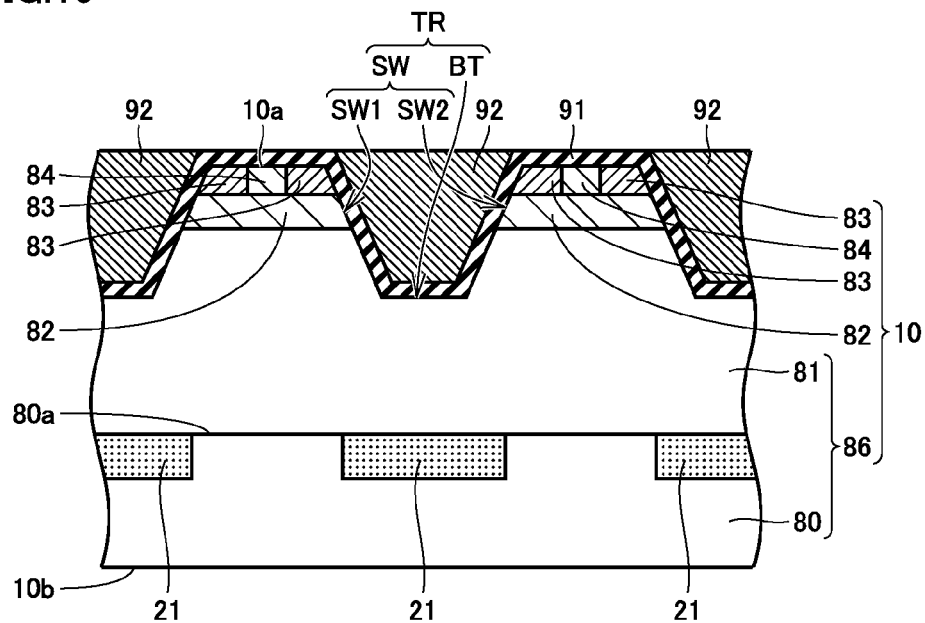
FIG. 15 is a schematic cross sectional view schematically showing a tenth step of the method for manufacturing the silicon carbide semiconductor device in accordance with the first embodiment of the present invention.

Next, the gate electrode forming step (S60: FIG. 5) is performed. Referring to FIG. 15, gate electrode 92 is formed in contact with gate insulating film 91. Specifically, gate electrode 92 is formed in trench TR so as to fill the region in trench TR through gate insulating film 91. A method for forming gate electrode 92 can be performed, for example, by forming a film of a conductor or doped polysilicon and by a CMP (Chemical Mechanical Polishing).

Figure 16:
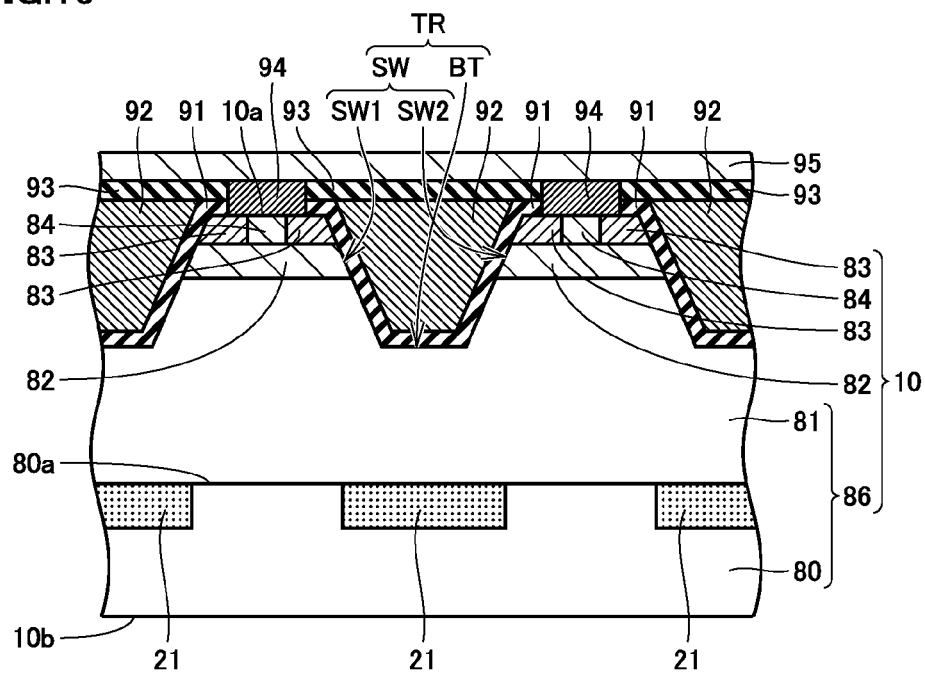
FIG. 16 is a schematic cross sectional view schematically showing an eleventh step of the method for manufacturing the silicon carbide semiconductor device in accordance with the first embodiment of the present invention.

Referring to FIG. 16, an interlayer insulating film 93 is formed on gate electrode 92 and gate insulating film 91 so as to cover the exposed plane of gate electrode 92. Etching is performed so as to form an opening in interlayer insulating film 93 and gate insulating film 91. This opening allows each of source region 83 and contact region 84 to be exposed in second main surface 10a of silicon carbide substrate 10.

Next, a metal layer in contact with each of source region 83 and contact region 84 on second main surface 10a of silicon carbide substrate 10 is formed, for example, by sputtering. The metal layer is, for example, TiAlSi. Next, by heating the metal layer and silicon carbide substrate 10 to, for example, about 1000° C., at least a part of the above-described metal layer is silicided, so that source electrode 94 in ohmic junction with silicon carbide substrate 10 is formed. Next, source interconnection layer 95 is formed in contact with source electrode 94.

Figure 17:
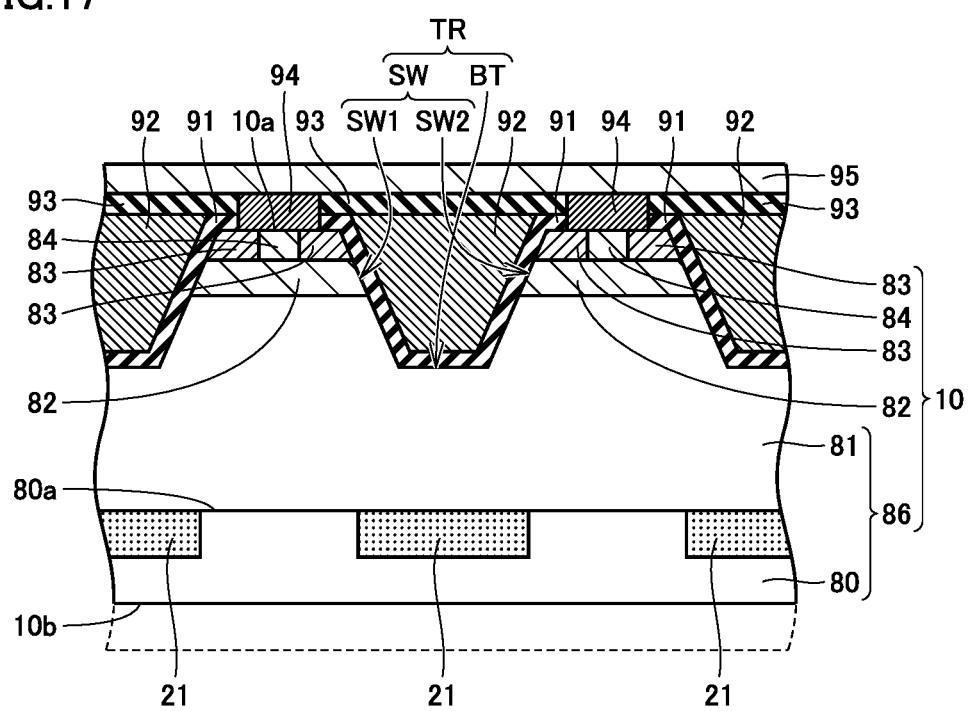
FIG. 17 is a schematic cross sectional view schematically showing a twelfth step of the method for manufacturing the silicon carbide semiconductor device in accordance with the first embodiment of the present invention.

Next, the backside surface grinding step (S70: FIG. 5) is performed. For example, by pressing first main surface 10b of silicon carbide substrate 10 against a grinding surface of a grinding device, silicon carbide single-crystal substrate 80 is ground, so that silicon carbide single-crystal substrate 80 is thinned to a desired thickness (refer to FIG. 17). A damaged layer formed on silicon carbide single-crystal substrate 80 may be removed by grinding the backside surface.

Next, the drain electrode forming step (S80: FIG. 5) is performed. A metal layer made of, for example, NiSi is formed in contact with first main surface 10b of silicon carbide substrate 10. The metal layer can be, for example, TiAlSi. Formation of the metal layer is performed preferably by the sputtering method. Formation of the metal layer can be performed by evaporation. Next, by heating the above-described metal layer using, for example, laser irradiation to the temperature of, for example, 1000° C., at least a part of the above-described metal layer is silicided to become drain electrode 98. Drain electrode 98 is in ohmic junction with silicon carbide single-crystal substrate 80. Accordingly, MOSFET 1 as the silicon carbide semiconductor device in accordance with the first embodiment is obtained.

Next, functions and effects of MOSFET 1 as the silicon carbide semiconductor device in accordance with the first embodiment will be described.

According to MOSFET 1 and the method for manufacturing the same according to the first embodiment, first second conductivity type region 21 being surrounded by first conductivity type region 86 and having the second conductivity type is provided. The impurity concentration of first second conductivity type region 21 is lower than the impurity concentration of first conductivity type region 86. When viewed in a cross section, and it is provided that a contact point at which a boundary surface between first conductivity type region 86 and body region 82 is in contact with first side wall surface SW1 is first contact point C1, and a contact point at which a boundary surface between first conductivity type region 86 and body region 82 is in contact with second side wall surface SW2 is second contact point C2, first second conductivity type region 21 is provided so as to face region R between first contact point C1 and second contact point C2 and be separated from first main surface 10b. Accordingly, since the electric capacity between gate electrode 92 and drain electrode 98 can be reduced effectively, the switching characteristics of the silicon carbide semiconductor device can be improved. Moreover, the impurity concentration of first p-type region 21 is lower than the impurity concentration of first conductivity type region 86. Accordingly, interference with a current path in the case where the transistor is shifted to the on-state is minimized, so that increase in the on resistance can be suppressed.

Moreover, according to MOSFET 1 in accordance with the first embodiment, first conductivity type region 86 includes silicon carbide single-crystal substrate 80 constituting first main surface 10b, having third main surface 80a opposite to first main surface 10b, and having a first impurity concentration, and drift region 81 provided between third main surface 80a of silicon carbide single-crystal substrate 80 and body region 82 and having the second impurity concentration which is lower than the first impurity concentration. Accordingly, the switching characteristics of the silicon carbide semiconductor device having silicon carbide single-crystal substrate 80 and drift region 81 can be improved.

Further, according to MOSFET 1 in accordance with the first embodiment, first second conductivity type region 21 is provided so as to be in contact with drift region 81 on the plane along third main surface 80a of silicon carbide single-crystal substrate 80, and the region other than the region in contact with drift region 81 is surrounded by silicon carbide single-crystal substrate 80, and the impurity concentration of first second conductivity type region 21 is lower than the first impurity concentration. Accordingly, the parasitic capacitance component in the drift region can be reduced by depletion, so that the transient response performance can be improved.

Further, according to MOSFET 1 in accordance with the first embodiment, the impurity concentration of first second conductivity type region 21 is higher than the second impurity concentration. Accordingly, the parasitic capacitance component in the drift region can be reduced by depletion, so that the transient response performance can be improved.

Further, according to MOSFET 1 and the method for manufacturing the same in accordance with the first embodiment, a ratio obtained by dividing a width W2 of first second conductivity type region 21 along a direction parallel to first main surface 10b by a width W1 of a region connecting first contact point C1 and second contact point C2 when viewed in a cross section is greater than or equal to 0.8 and less than or equal to 1.2. Setting the ratio to be greater than or equal to 0.8 sufficiently reduces the electric capacity between gate electrode 92 and drain electrode 98, so that the switching characteristics of the silicon carbide semiconductor device can be improved effectively. Setting the ratio to be less than or equal to 1.2 can suppress an increase in the on resistance of the silicon carbide semiconductor device.

According to the method for manufacturing MOSFET 1 in accordance with the first embodiment, the step of preparing a silicon carbide substrate includes the step of forming first conductivity type region 86 constituting first main surface 10b and having a first conductivity type. The step of forming first conductivity type region 86 includes the step of preparing silicon carbide single-crystal substrate 80 constituting first main surface 10b, having third main surface 80a opposite to first main surface 10b, and having a first impurity concentration, and the step of forming drift region 81 being in contact with third main surface 80a of silicon carbide single-crystal substrate 80 and having a second impurity concentration which is lower than the first impurity concentration. Accordingly, the switching characteristics of the silicon carbide semiconductor device having silicon carbide single-crystal substrate 80 and drift region 81 can be improved.

Moreover, according to the method for manufacturing MOSFET 1 in accordance with the first embodiment, the step of preparing silicon carbide substrate 10 includes the step of forming first second conductivity type region 21 by conducting ion implantation to at least silicon carbide single-crystal substrate 80. Accordingly, first second conductivity type region 21 in contact with at least silicon carbide single-crystal substrate 80 can be formed.

Further, according to the method for manufacturing MOSFET 1 in accordance with the first embodiment, the step of preparing silicon carbide substrate 10 includes, after the step of preparing silicon carbide single-crystal substrate 80 and before the step of forming drift region 81, the step of forming first second conductivity type region 21 by conducting ion implantation from a side of third main surface 80a of silicon carbide single-crystal substrate 80. Accordingly, first second conductivity type region 21 located near third main surface 80a of silicon carbide single-crystal substrate 80 can be formed.

Second Embodiment

Figure 18:
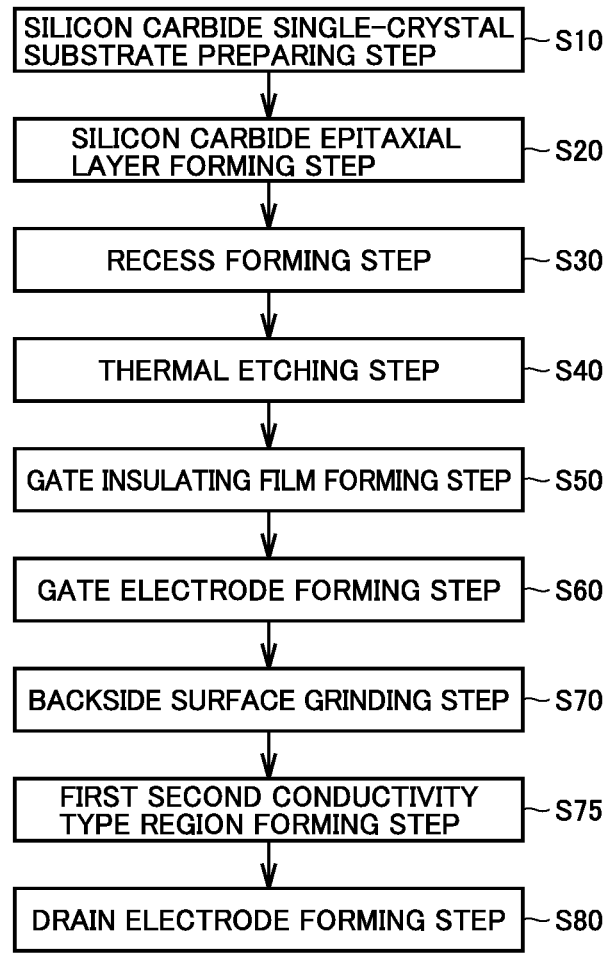
FIG. 18 is a flowchart schematically showing a method for manufacturing a silicon carbide semiconductor device in accordance with a second embodiment of the present invention.

Next, a method for manufacturing a MOSFET as a silicon carbide semiconductor substrate in accordance with the second embodiment of the present invention will be described with reference to FIG. 18. The method for manufacturing a MOSFET in accordance with the second embodiment is different from the method for manufacturing a MOSFET in accordance with the first embodiment in that formation of first p-type region 21 is performed after the step of grinding the backside surface of silicon carbide substrate 10, and other points are substantially the same as the method for manufacturing a MOSFET in accordance with the first embodiment. Moreover, a configuration of the MOSFET in accordance with the second embodiment is substantially the same as the configuration of the MOSFET in accordance with the first embodiment.

Figure 19:
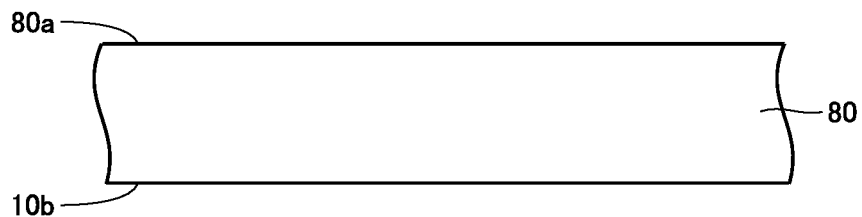
FIG. 19 is a schematic cross sectional view schematically showing a first step of the method for manufacturing the silicon carbide semiconductor device in accordance with the second embodiment of the present invention.
Figure 20:
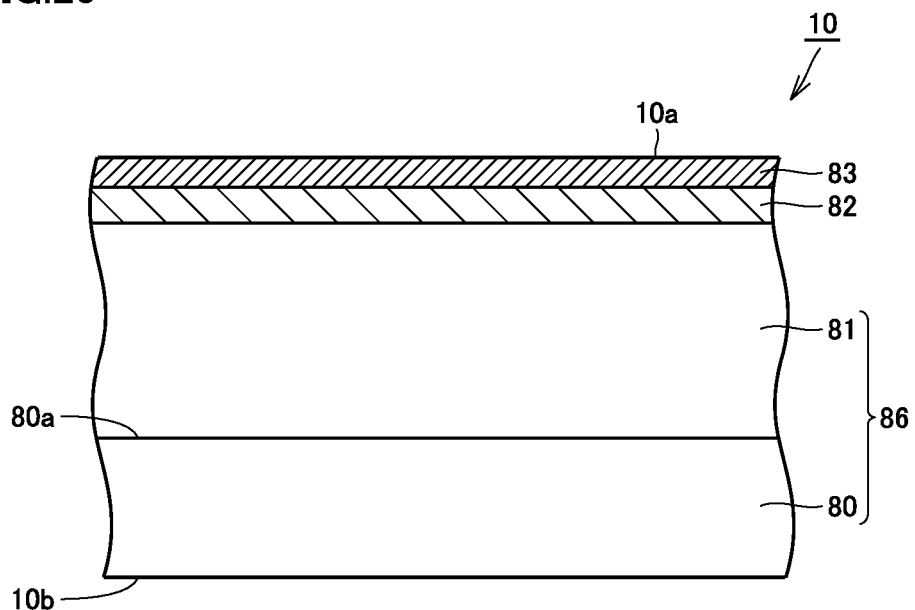
FIG. 20 is a schematic cross sectional view schematically showing a second step of the method for manufacturing the silicon carbide semiconductor device in accordance with the second embodiment of the present invention.

Firstly, the silicon carbide single-crystal substrate preparing step (S10: FIG. 18) is performed in the same method as the first embodiment, so that silicon carbide single-crystal substrate 80 having first main surface 10b and third main surface 80a opposite to first main surface 10b is prepared (refer to FIG. 19). Next, the silicon carbide epitaxial layer forming step (S20: FIG. 18) is performed in the same method as the first embodiment, so that drift region 81 is formed on silicon carbide single-crystal substrate 80. Next, referring to FIG. 20, body region 82 and source region 83 are formed on drift region 81. For example, ion implantation of impurities such as aluminum is conducted with respect to drift region 81, so that body region 82 in contact with drift region 81 is formed. Moreover, for example, ion implantation of impurities such as phosphorus is conducted with respect to body region 82, so that source region 83 in contact with body region 82 is formed (refer to FIG. 20).

Figure 21:
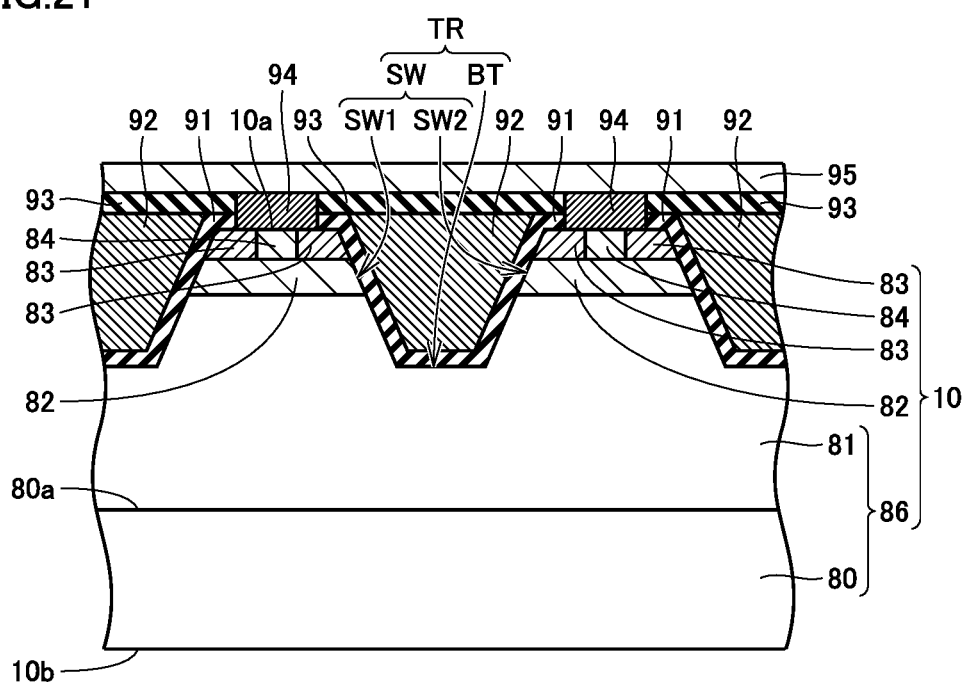
FIG. 21 is a schematic cross sectional view schematically showing an eleventh step of the method for manufacturing the silicon carbide semiconductor device in accordance with the second embodiment of the present invention.

Next, the recess forming step (S30: FIG. 18), the thermal etching step (S40: FIG. 18), the gate insulating film forming step (S50: FIG. 18), the gate electrode forming step (S60: FIG. 18), and the like are performed in the same method as the first embodiment. Accordingly, there are formed silicon carbide substrate 10 including n-type region 86, body region 82, source region 83 provided on body region 82 so as to be separated apart from n-type region 86 by body region 82, and contact region 84, and gate electrode 92 formed in trench TR which is formed of side wall surface SW penetrating through source region 83 and body region 82 to reach n-type region 86 and bottom portion BT located in n-type region 86. Gate insulating film 91 is in contact with silicon carbide substrate 10 at side wall surface SW and bottom portion BT of trench TR. Source electrode 94 is in contact with source region 83 and contact region 84 at second main surface 10a of silicon carbide substrate 10. Source interconnection layer 95 is formed in contact with source electrode 94 and interlayer insulating film 93 (refer to FIG. 21).

Figure 22:
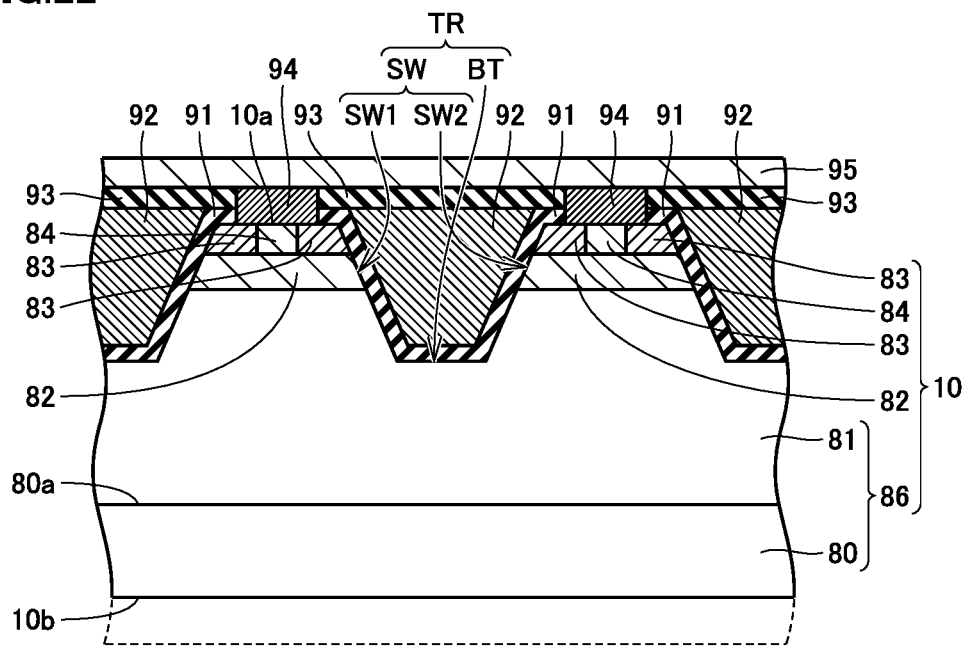
FIG. 22 is a schematic cross sectional view schematically showing a twelfth step of the method for manufacturing the silicon carbide semiconductor device in accordance with the second embodiment of the present invention.

Next, the backside surface grinding step (S70: FIG. 18) is performed. For example, first main surface 10b of silicon carbide substrate 10 is pressed against a grinding surface of a grinding device, so that silicon carbide single-crystal substrate 80 is ground, and silicon carbide single-crystal substrate 80 is thinned to a desired thickness (refer to FIG. 22). A damaged layer formed on silicon carbide single-crystal surface 80 may be removed by the backside surface grinding.

Figure 23:
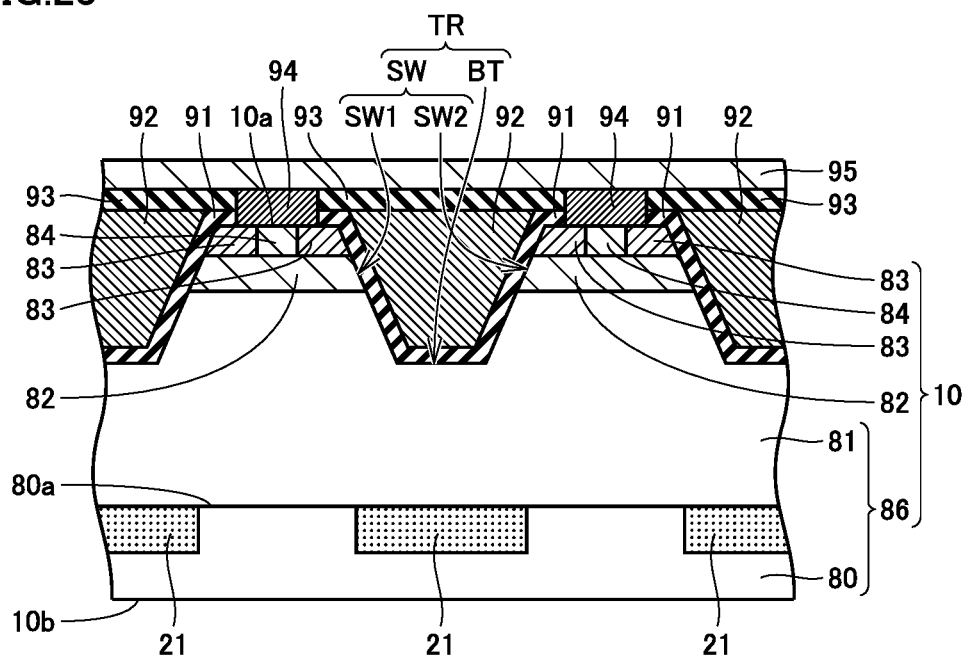
FIG. 23 is a schematic cross sectional view schematically showing a thirteenth step of the method for manufacturing the silicon carbide semiconductor device in accordance with the second embodiment of the present invention.

Next, the first p-type region forming step (S75: FIG. 18) is performed. Referring to FIG. 23, for example, from silicon carbide single-crystal substrate 80 on a side of first main surface 10b, ion implantation of, for example, aluminum is conducted, so that first p-type region 21 exposed to the plane along third main surface 80a of silicon carbide single-crystal substrate 80 is formed. The impurity concentration of first p-type region 21 is lower than the impurity concentration of silicon carbide single-crystal substrate 80.

Next, the drain electrode forming step (S80: FIG. 18) is performed. A metal layer made of, for example, NiSi is formed in contact with first main surface 10b of silicon carbide substrate 10. The metal layer may be, for example, TiAlSi. Formation of the metal layer is preferably performed by the sputtering method. Formation of the metal layer may be performed by evaporation. Next, by heating the above-described metal layer to the temperature of, for example, about 1000° C. using, for example, laser irradiation, at least a part of the metal layer is silicided to become drain electrode 98. Drain electrode 98 is in ohmic conjunction with silicon carbide single-crystal substrate 80. Accordingly, MOSFET 1 (refer to FIG. 1) as a silicon carbide semiconductor device in accordance with the second embodiment is obtained.

Next, functions and effects of MOSFET 1 as the silicon carbide semiconductor device in accordance with the second embodiment will be described.

According to the method for manufacturing MOSFET 1 in accordance with the second embodiment, the step of preparing a silicon carbide substrate includes the step of forming first p-type region 21 by conducting ion implantation from the side of first main surface 10b of silicon carbide single-crystal substrate 80. Accordingly, first p-type region 21 located near first main surface 10b of silicon carbide single-crystal substrate 80 can be formed.

Moreover, according to the method for manufacturing MOSFET 1 in accordance with the second embodiment, the step of preparing a silicon carbide substrate includes the step of grinding the silicon carbide single-crystal substrate 80 on the side of first main surface 10b. First p-type region 21 is formed by conducting ion implantation with respect to silicon carbide single-crystal substrate 80 from the side of first main surface 10b after the step of grinding silicon carbide single-crystal substrate 80 on the side of first main surface 10b. Accordingly, since silicon carbide single-crystal substrate 80 is thinned, the ion implantation depth can be small.

Third Embodiment

Next, a structure of a MOSFET as a silicon carbide semiconductor device in accordance with the third embodiment of the present invention will be described with reference to FIG. 24. The structure of the MOSFET in accordance with the third embodiment is different from the structure of the MOSFET in accordance with the first embodiment in that first p-type region 21 is provided so as to intersect with a plane along third main surface 80a of silicon carbide single-crystal substrate 80, and other points are substantially the same as the structure of the MOSFET in accordance with the first embodiment.

Referring to FIG. 24, first p-type region 21 of MOSFET 1 in accordance with the third embodiment is provided so as to be in contact with each of silicon carbide single-crystal substrate 80 and drift region 81 and intersect with the plane along third main surface 80a of silicon carbide single-crystal substrate 80. In other words, when viewed in a cross section, first p-type region 21 is provided to extend from the side of silicon carbide single-crystal substrate 80 to the side of drift region 81 so as to transverse the plane along third main surface 80a of silicon carbide single-crystal substrate 80. The impurity concentration of first p-type region 21 is lower than the second impurity concentration of drift region 81.

Next, one example of a method for manufacturing the MOSFET as the silicon carbide semiconductor device in accordance with the third embodiment of the present invention will be described with reference to FIG. 24.

Firstly, the silicon carbide single-crystal substrate preparing step (S10: FIG. 18) is performed by the same method as the second embodiment. Next, a first drift layer 81a is formed by the epitaxial growth on third main surface 80a of silicon carbide single-crystal substrate 80. Next, ion implantation of impurities such as aluminum is conducted with respect to a part of a plane opposite to the plane in contact with third main surface 80a of first drift layer 81a, so that first p-type region 21 is formed to extend from the side of silicon carbide single-crystal substrate 80 to the side of first drift layer 81a so as to traverse the plane along third main surface 80a of silicon carbide single-crystal substrate 80, when viewed in a cross section. Next, a second drift layer 81b is formed by the epitaxial growth on the plane formed by first drift layer 81a and first p-type region 21. Accordingly, first p-type region 21 is surrounded by first drift layer 81a, second drift layer 81b, and silicon carbide single-crystal substrate 80. First drift layer 81a and second drift layer 81b form drift region 81.

Next, by the same method as the first embodiment, the recess forming step (S30: FIG. 5), the thermal etching step (S40: FIG. 5), the gate insulating film forming step (S50: FIG. 5), the gate electrode forming step (S60: FIG. 5), the backside surface grinding step (S70: FIG. 5), the drain electrode forming step (S30: FIG. 5), and the like are performed, so that MOSFET 1 in accordance with the third embodiment is manufactured.

According to MOSFET 1 in accordance with the third embodiment, first second conductivity type region 21 is provided so as to intersect with the plane along third main surface 80a of silicon carbide single-crystal substrate 80, and the impurity concentration of first second conductivity type region 21 is lower than the second impurity concentration. Accordingly, the parasitic capacitance component in the drift region can be reduced by depletion, so that the transient response performance can be improved.

Fourth Embodiment

Next, a structure of a MOSFET as a silicon carbide semiconductor device in accordance with the fourth embodiment of the present invention will be described with reference to FIG. 25. The structure of the MOSFET in accordance with the fourth embodiment is different from the structure of the MOSFET in accordance with the first embodiment in that first p-type region 21 is surrounded by drift region 81, and other points are substantially the same as the structure of the MOSFET in accordance with the first embodiment.

Figure 25:
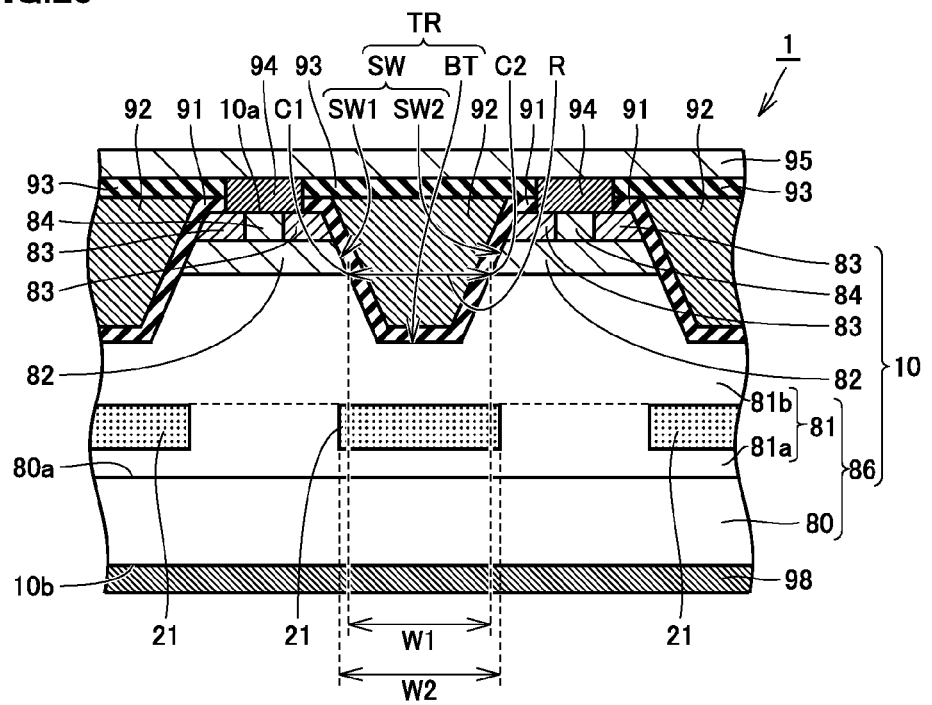
FIG. 25 is a schematic cross sectional view schematically showing a configuration of a silicon carbide semiconductor device in accordance with a fourth embodiment of the present invention.

Referring to FIG. 25, first p-type region 21 of MOSFET 1 in accordance with the fourth embodiment is surrounded by drift region 81. First p-type region 21 is arranged between bottom portion BT of trench TR and third main surface 80a of silicon carbide single-crystal substrate 80, and is separated from each of bottom portion BT of trench TR and third main surface 80a of silicon carbide single-crystal substrate 80. The impurity concentration of first p-type region 21 is lower than the second impurity concentration of drift region 81.

Next, one example of a method for manufacturing the MOSFET as the silicon carbide semiconductor device in accordance with the fourth embodiment of the present invention will be described with reference to FIG. 25.

Firstly, the silicon carbide single-crystal substrate preparing step (S10: FIG. 18) is performed in the same method as the second embodiment. Next, first drift layer 81a is formed by the epitaxial growth on third main surface 80a of silicon carbide single-crystal substrate 80. Next, ion implantation of impurities such as aluminum is performed with respect to a part of a plane opposite to the plane in contact with third main surface 80a of first drift layer 81a, so that first p-type region 21 surrounded by first drift layer 81a is formed. Next, second drift layer 81b is formed by the epitaxial growth on the plane formed by first drift layer 81a and first p-type region 21. Accordingly, first p-type region 21 is surrounded by first drift layer 81a and second drift layer 81b. First drift layer 81a and second drift layer 81b form drift region 81.

Next, by the same method as the first embodiment, the recess forming step (S30: FIG. 5), the thermal etching step (S40: FIG. 5), the gate insulating film forming step (S50: FIG. 5), the gate electrode forming step (S60: FIG. 5), the backside surface grinding step (S70: FIG. 5), the drain electrode forming step (S30: FIG. 5), and the like are performed, so that MOSFET 1 in accordance with the fourth embodiment is manufactured.

Next, other example of the method for manufacturing the MOSFET as the silicon carbide semiconductor device in accordance with the fourth embodiment of the present invention will be described.

Firstly, by the same method as the second embodiment, the silicon carbide single-crystal substrate preparing step (S10: FIG. 18), the silicon carbide epitaxial layer step (S20: FIG. 18), the recess forming step (S30: FIG. 18), the thermal etching step (S40: FIG. 18), the gate insulating film forming step (S50: FIG. 18), the gate electrode forming step (S60: FIG. 18), and the like are performed.

Next, the backside surface grinding step (S70: FIG. 18) is performed. Specifically, all of silicon carbide single-crystal substrate 80 is removed by grinding until drift region 81 is exposed. Next, ion implantation of impurities such as phosphorus with respect to first main surface 10b of silicon carbide substrate 10 is performed, so that highly concentrated n-type region 80 may be formed where first main surface 10b of silicon carbide substrate 10 has a higher impurity concentration than drift region 81. Highly concentrated n-type region 80 may have the impurity concentration which is substantially equal to that of silicon carbide single-crystal substrate 80, for example. Next, drain electrode 98 is formed in contact with highly concentrated n-type region 80 forming first main surface 10b of silicon carbide substrate 10. Accordingly, MOSFET 1 in accordance with the fifth embodiment is formed.

According to MOSFET 1 in accordance with the fourth embodiment, first second conductivity type region 21 is provided so as to be surrounded by drift region 81, and the impurity concentration of first second conductivity type region 21 is lower than the second impurity concentration. Accordingly, the parasitic capacitance component in the drift region can be reduced by depletion, so that the transient response performance can be improved.

Fifth Embodiment

Next, a structure of a MOSFET as a silicon carbide semiconductor device in accordance with the fifth embodiment of the present invention will be described with reference to the FIG. 26. The structure of the MOSFET in accordance with the fifth embodiment is different from the structure of the MOSFET in accordance with the first embodiment in that first p-type region 21 is in contact with silicon carbide single-crystal substrate 80 on third main surface 80a of silicon carbide single-crystal substrate 80 and in that the region of first p-type region 21 other than the region in contact with silicon carbide single-crystal substrate 80 is surrounded by drift region 81, and other points are substantially the same as the structure of the MOSFET in accordance with the first embodiment.

Figure 26:
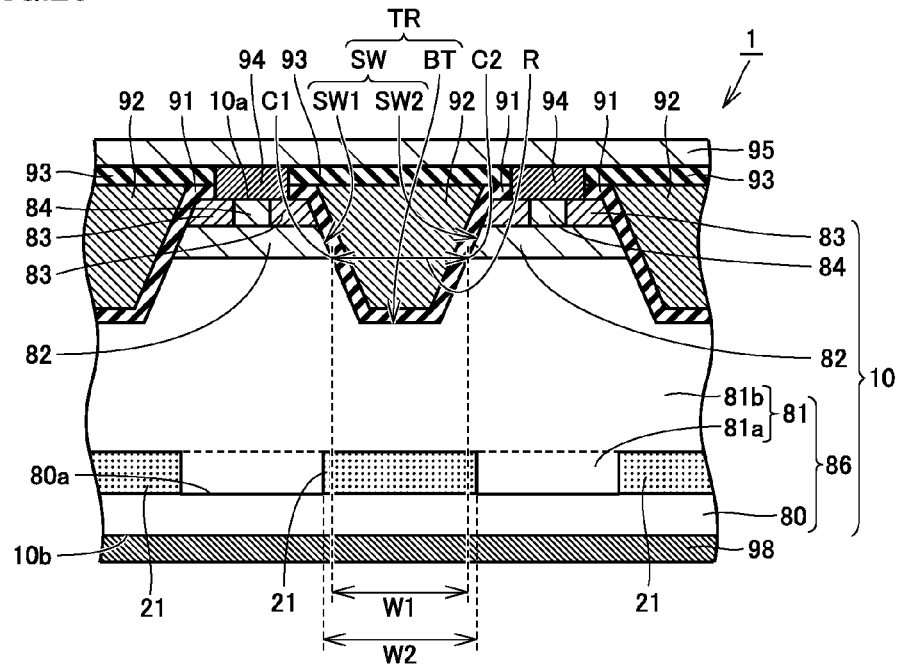
FIG. 26 is a schematic cross sectional view schematically showing a configuration of a silicon carbide semiconductor device in accordance with a fifth embodiment of the present invention.

Referring to FIG. 26, in MOSFET 1 in accordance with the fifth embodiment, first p-type region 21 is provided on third main surface 80a of silicon carbide single-crystal substrate 80. First p-type region 21 is in contact with silicon carbide single-crystal substrate 80 on third main surface 80a of silicon carbide single-crystal substrate 80, and the region of first p-type region 21 other than the region in contact with silicon carbide single-crystal substrate 80 is surrounded by drift region 81. First p-type region 21 is arranged to face bottom portion BT of trench TR and is separated from bottom portion BT of trench TR. The impurity concentration of first p-type region 21 is lower than the second impurity concentration of drift region 81.

Drift region 81 is constituted of first drift layer 81a in contact with silicon carbide single-crystal substrate 80 and first p-type region 21, and second drift layer 81b provided on first drift layer 81a and first p-type region 21. The impurity concentration of first drift layer 81a may be higher than the impurity concentration of second drift layer 81b. The impurity concentration of first drift layer 81a may be equal to the impurity concentration of silicon carbide single-crystal substrate 80.

Next, one example of the method for manufacturing the MOSFET as the silicon carbide semiconductor device in accordance with the fifth embodiment of the present invention will be described with reference to FIG. 26.

Firstly, the silicon carbide single-crystal substrate preparing step (S10: FIG. 18) is performed in the same method as the second embodiment. Next, a p-type layer having the impurity concentration equal to that of first p-type region 21 is formed by the epitaxial growth on third main surface 80a of silicon carbide single-crystal substrate 80. Next, ion implantation of impurities such as phosphorus is partially conducted with respect to the p-type layer, so that first p-type region 21 partially arranged on third main surface 80a of silicon carbide single-crystal substrate 80 is formed. The region to which the ion implantation of impurities such as phosphorus is conducted becomes first drift layer 81a. Next, second drift layer 81b is formed by the epitaxial growth on first p-type region 21 and first drift layer 81a.

Next, by the same method as the first embodiment, the recess forming step (S30: FIG. 5), the thermal etching step (S40: FIG. 5), the gate insulating film forming step (S50: FIG. 5), the gate electrode forming step (S60: FIG. 5), the backside surface grinding step (S70: FIG. 5), the drain electrode forming step (S80: FIG. 5), and the like are performed, so that MOSFET 1 in accordance with the fifth embodiment is manufactured.

Sixth Embodiment

Next, a structure of a MOSFET as a silicon carbide semiconductor device in accordance with the sixth embodiment of the present invention will be described with reference to FIG. 27. The structure of the MOSFET in accordance with the sixth embodiment is different from the structure of the MOSFET in accordance with the first embodiment in having a second p-type region 22, and other points are substantially the same as the structure of the MOSFET in accordance with the first embodiment.

Figure 27:
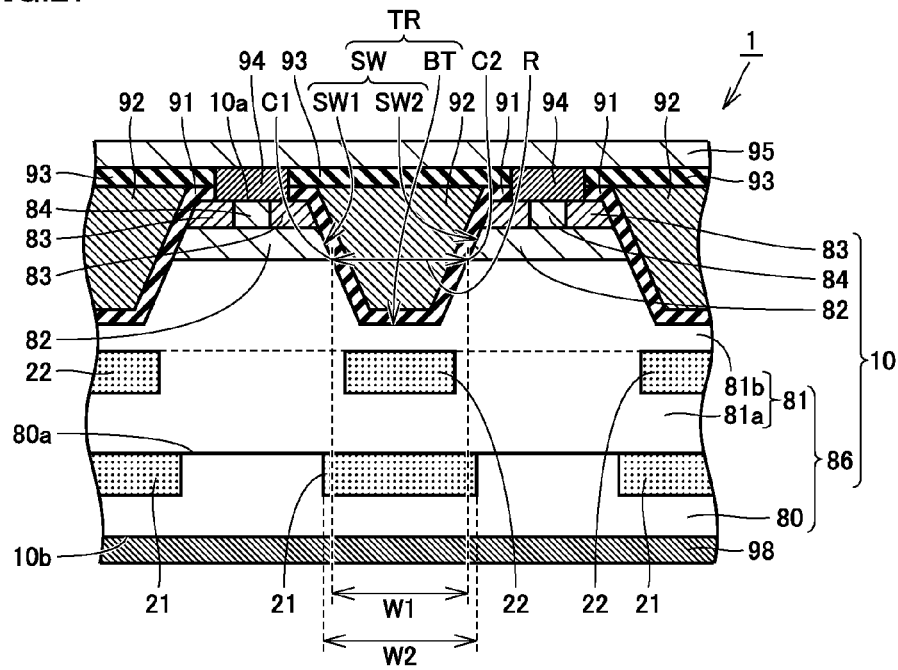
FIG. 27 is a schematic cross sectional view schematically showing a silicon carbide semiconductor device in accordance with a sixth embodiment of the present invention.

Referring to FIG. 27, MOSFET 1 in accordance with the sixth embodiment has second p-type region 22. Second p-type region 22 contains impurities such as aluminum and has the p-type conductivity type. Second p-type region 22 is surrounded by drift region 81. Second p-type region 22 is arranged between bottom portion BT of trench TR and first p-type region 21 and configured to be able to relax the concentration of electric field at the boundary portion between bottom portion BT of trench TR and side wall surface SW. Second p-type region 22 is apart from each of bottom portion BT of trench TR and first p-type region 21. The impurity concentration of second p-type region 22 is higher than the impurity concentration of drift region 81 surrounding second p-type region 22. Preferably, the impurity concentration of second p-type region 22 is five or more times higher than the impurity concentration of first p-type region 21. The impurity concentration of first p-type region 21 is, for example, about $4 \times 10^{15}$ cm$^{-3}$, and the impurity concentration of second p-type region 22 is, for example, about $2 \times 10^{16}$ cm$^{-3}$, and the first impurity concentration of drift region 81 is, for example, about $8 \times 10^{15}$ cm$^{-3}$.

Next, one example of the method for manufacturing the MOSFET as the silicon carbide semiconductor device in accordance with the sixth embodiment of the present invention will be described with reference to FIG. 27.

Firstly, by the same method as the first embodiment, the silicon carbide single-crystal substrate preparing step (S10: FIG. 5) and the first second conductivity type region forming step (S20: FIG. 5) are performed, so that silicon carbide single-crystal substrate 80 is prepared in which first p-type region 21 exposed to the plane along third main surface 80a is formed. Next, first drift layer 81a is formed by the epitaxial growth on third main surface 80a of silicon carbide single-crystal substrate 80 and first p-type region 21. Next, ion implantation of impurities such as aluminum is conducted with respect to a part of the plane of first drift layer 81a opposite to the plane in contact with third main surface 80a, so that second p-type region 22 surrounded by first drift layer 81a is formed. Next, second drift layer 81b is formed by the epitaxial growth on the plane formed by first drift layer 81a and second p-type region 22. Accordingly, second p-type region 22 is surrounded by first drift layer 81a and second drift layer 81b. First drift layer 81a and second drift layer 81b form drift region 81.

Next, by the same method as the first embodiment, the recess forming step (S30: FIG. 5), the thermal etching step (S40: FIG. 5), the gate insulating film forming step (S50: FIG. 5), the gate electrode forming step (S60: FIG. 5), the backside surface grinding step (S70: FIG. 5), the drain electrode forming step (S80: FIG. 5), and the like are performed, so that MOSFET 1 in accordance with the sixth embodiment is manufactured.

According to MOSFET 1 and the method for manufacturing the same in accordance with the sixth embodiment, silicon carbide substrate 10 further includes second second conductivity type region 22 located between bottom portion BT of trench TR and first second conductivity type region 21 when viewed in a cross section, and the impurity concentration of second second conductivity type region 22 is higher than the impurity concentration of first conductivity type region 86. Accordingly, concentration of electric field in a boundary portion between bottom portion BT of trench TR and side wall surface SW can be relaxed.

Moreover, according to MOSFET 1 and the method for manufacturing the same in accordance with the sixth embodiment, the impurity concentration of second second conductivity type region 22 is five or more times higher than the impurity concentration of first second conductivity type region 21. Accordingly, concentration of electric field in a boundary portion between bottom portion BT of trench TR and side wall surface SW can be relaxed.

It should be noted that, in each of the above-described embodiments, description is made to define the n-type as the first conductivity type, and the p-type as the second conductivity type. However, the p-type may be the first conductivity type, and the n-type may be the second conductivity type.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1 MOSFET (silicon carbide semiconductor device); 10 silicon carbide substrate; 10a second main surface; 10b first main surface; 21 first p-type region (first second conductivity type region); 22 second p-type region (second second conductivity type region); 40, 60, 61 mask layer; 80 silicon carbide single-crystal substrate (highly concentrated n-type region); 80a third main surface; 81 drift region; 81a first drift layer; 81b second drift layer; 82 body region; 83 source region; 84 contact region; 86 n-type region (first conductivity type region); 91 gate insulating film; 92 gate electrode; 93 interlayer insulating film; 94 source electrode; 95 source interconnection layer; 98 drain electrode; BT bottom portion; C1 first contact point; C2 second contact point; R region; SW side wall surface; SW1 first side wall surface; SW2 second side wall surface; TQ recess; TR trench; W1, W2 width.

The invention claimed is:

1. A silicon carbide semiconductor device, comprising:
a silicon carbide substrate having a first main surface and a second main surface opposite to the first main surface, and having a trench formed in the second main surface;
a gate electrode being provided in the trench; and
a drain electrode being provided in contact with the first main surface,
the silicon carbide substrate including:
a first conductivity type region constituting the first main surface and having a first conductivity type;
a body region being provided on the first conductivity type region and having a second conductivity type which is different from the first conductivity type;
a source region being provided on the body region so as to be separated apart from the first conductivity type region, constituting the second main surface, and having the first conductivity type; and
a first second conductivity type region being surrounded by the first conductivity type region and having the second conductivity type,
the trench being formed of a side wall surface penetrating through the source region and the body region to reach the first conductivity type region, and a bottom portion being located in the first conductivity type region, the side wall surface having a first side wall surface and a second side wall surface facing each other when viewed in a cross section, an impurity concentration of the first second conductivity type region being lower than an impurity concentration of the first conductivity type region, when viewed in a cross section, and it is provided that a contact point at which a boundary surface between the first conductivity type region and the body region is in contact with the first side wall surface is a first contact point, and that a contact point at which a boundary surface between the first conductivity type region and the body region is in contact with the second side wall surface is a second contact point, the first second conductivity type region being provided so as to face a region between the first contact point and the second contact point and be separated from the first main surface, wherein the first conductivity type region includes: a silicon carbide single-crystal substrate constituting the first main surface, having a third main surface opposite to the first main surface, and having a first impurity concentration; and a drift region being provided between the third main surface of the silicon carbide single-crystal substrate and the body region and having a second impurity concentration which is lower than the first impurity concentration, the first second conductivity type region being in direct physical contact with the silicon carbide single-crystal substrate.

2. The silicon carbide semiconductor device according to claim 1, wherein the first second conductivity type region is provided so as to intersect with a plane which is along the third main surface of the silicon carbide single-crystal substrate and be in contact with the drift region and the silicon carbide single-crystal substrate, and an impurity concentration of the first second conductivity type region is lower than the second impurity concentration.

3. The silicon carbide semiconductor device according to claim 1, wherein the first second conductivity type region is provided so as to be in contact with the drift region on a plane which is along the third main surface of the silicon carbide single-crystal substrate, and a region other than the region in contact with the drift region is provided so as to be surrounded by the silicon carbide single-crystal substrate, and an impurity concentration of the first second conductivity type region is lower than the first impurity concentration.

4. The silicon carbide semiconductor device according to claim 3, wherein an impurity concentration of the first second conductivity type region is higher than the second impurity concentration.

5. The silicon carbide semiconductor device according to claim 1, wherein the silicon carbide substrate further includes a second second conductivity type region located between the bottom portion of the trench and the first second conductivity type region when viewed in a cross section, and an impurity concentration of the second second conductivity type region is higher than an impurity concentration of the first conductivity type region.

6. The silicon carbide semiconductor device according to claim 5, wherein the impurity concentration of the second second conductivity type region is five or more times higher than an impurity concentration of the first second conductivity type region.

7. The silicon carbide semiconductor device according to claim 1, wherein a ratio obtained by dividing a width of the first second conductivity type region along a direction parallel to the first main surface by a width of a region connecting the first contact point and the second contact point when viewed in a cross section is greater than or equal to 0.8 and less than or equal to 1.2.

8. A method for manufacturing a silicon carbide semiconductor device comprising the steps of:

preparing a silicon carbide substrate having a first main surface and a second main surface opposite to the first main surface and having a trench formed in the second main surface;

forming a gate electrode in the trench; and forming a drain electrode in contact with the first main surface, the silicon carbide substrate including:

a first conductivity type region constituting the first main surface and having a first conductivity type;

a body region being provided on the first conductivity type region and having a second conductivity type which is different from the first conductivity type;

a source region being provided on the body region so as to be separated apart from the first conductivity type region, constituting the second main surface, and having the first conductivity type; and a first second conductivity type region being surrounded by the first conductivity type region and having the second conductivity type, the trench being formed of a side wall surface penetrating through the source region and the body region to reach the first conductivity type region, and a bottom portion located in the first conductivity type region, the side wall surface having a first side wall surface and a second side wall surface facing each other when viewed in a cross section, an impurity concentration of the first second conductivity type region being lower than an impurity concentration of the first conductivity type region, when viewed in a cross section, and it is provided that a contact point at which a boundary surface between the first conductivity type region and the body region is in contact with the first side wall surface is a first contact point, and that a contact point at which a boundary surface between the first conductivity type region and the body region is in contact with the second side wall surface is a second contact point, the first second conductivity type region being provided so as to face a region between the first contact point and the second contact point and be separated from the first main surface, wherein the step of preparing a silicon carbide substrate includes the step of forming the first conductivity region constituting the first main surface and having the first conductivity type, and the step of forming the first conductivity type region includes the steps of: preparing a silicon carbide single-crystal substrate constituting the first main surface, having a third main surface opposite to the first main surface, and having a first impurity concentration; and forming a drift region being in contact with the third main surface of the silicon carbide single-crystal substrate and having a second impurity concentration which is lower than the first impurity concentration, the first second conductivity type region being in direct physical contact with the silicon carbide single-crystal substrate.

9. The method for manufacturing a silicon carbide semiconductor device according to claim 8, wherein the step of preparing a silicon carbide substrate includes the step of forming the first second conductivity type region by conducting ion implantation with respect to at least the silicon carbide single-crystal substrate.

10. The method for manufacturing a silicon carbide semiconductor device according to claim 9, wherein the step of preparing a silicon carbide substrate includes, after the step of preparing a silicon carbide single-crystal substrate and before the step of forming a drift region, the step of forming the first second conductivity type region by conducting ion implantation from a side of the third main surface of the silicon carbide single-crystal substrate.

11. The method for manufacturing a silicon carbide semiconductor device according to claim 9, wherein the step of preparing a silicon carbide substrate includes the step of forming the first second conductivity type region by conducting ion implantation from a side of the first main surface of the silicon carbide single-crystal substrate.

12. The method for manufacturing a silicon carbide semiconductor device according to claim 11, wherein
the step of preparing a silicon carbide substrate includes
the step of polishing the silicon carbide single-crystal substrate on a side of the first main surface, and
the first second conductivity type region is formed by conducting ion implantation from a side of the first main surface of the silicon carbide single-crystal substrate after the step of polishing the first main surface side of the silicon carbide single-crystal substrate.

13. The method for manufacturing a silicon carbide semiconductor device according to claim 8, wherein
the silicon carbide substrate further includes a second second conductivity type region located between the bottom portion of the trench and the first second conductivity type region when viewed in a cross section, and
an impurity concentration of the second second conductivity type region is higher than an impurity concentration of the first conductivity type region.

14. The method for manufacturing a silicon carbide semiconductor device according to claim 13, wherein an impurity concentration of the second second conductivity type region is five or more times higher than an impurity concentration of the first second conductivity type region.

15. The method for manufacturing a silicon carbide semiconductor device according to claim 8, wherein a ratio obtained by dividing a width of the first second conductivity type region along a direction parallel to the first main surface by a width of a region connecting the first contact point and the second contact point when viewed in a cross section is greater than or equal to 0.8 and less than or equal to 1.2, when viewed in a cross section.

* * * * *